US012757536B2

United States Patent

(12) United States Patent
You et al.

(10) Patent No.: US 12,757,536 B2
(45) Date of Patent: Oct. 6, 2026

(54) LIGHT-EMITTING DEVICE

(71) Applicant: SAMSUNG ELECTRONICS CO., LTD., Suwon-si (KR)

(72) Inventors: Jiho You, Suwon-si (KR); Sanghyun Kim, Suwon-si (KR); Juwon Jeong, Suwon-si (KR); Sungwoo Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 460 days.

(21) Appl. No.: 18/371,835

(22) Filed: Sep. 22, 2023

(65) Prior Publication Data

US 2024/0274757 A1 Aug. 15, 2024

(30) Foreign Application Priority Data

Feb. 9, 2023 (KR) ........................ 10-2023-0017575

(51) Int. Cl.
*H10H 20/841* (2025.01)
*H10H 20/851* (2025.01)
(Continued)

(52) U.S. Cl.
CPC ...... *H10H 20/841* (2025.01); *H10H 20/8512* (2025.01); *H10H 29/8421* (2025.01); *H10H 29/8512* (2025.01)

(58) Field of Classification Search
CPC ............. H10H 20/851; H10H 20/8512; H10H 20/841; H10H 29/8512; H10H 29/8421
See application file for complete search history.

(56) References Cited

U.S. PATENT DOCUMENTS 2,624,238 A * 1/1953 Widdop ................. G02B 5/282 359/359
4,047,805 A * 9/1977 Sekimura ............. G02B 27/142 359/586
(Continued)

FOREIGN PATENT DOCUMENTS

CN 117894698 A * 4/2024 .............. H10P 74/23
KR 101091027 B1 * 12/2011 ........... H10H 20/841
(Continued)

OTHER PUBLICATIONS

Communication issued on Jul. 11, 2024 by the European Patent Office for European Patent Application No. 23218603.1.

*Primary Examiner* — David A Zarneke
(74) *Attorney, Agent, or Firm* — Sughrue Mion, PLLC

(57) ABSTRACT

A light-emitting device includes: a semiconductor light-emitting structure configured to emit light having a first wavelength; a wavelength conversion layer configured to convert the light which has the first wavelength into light having a second wavelength that is greater than the first wavelength; and a multi-inorganic-film coating layer spaced apart from a light-emitting surface with the wavelength conversion layer therebetween. The multi-inorganic-film coating layer includes a distributed Bragg reflector structure in which first and second inorganic films are alternately stacked, and an uppermost inorganic film farthest from the wavelength conversion layer from among the plurality of inorganic films has a greatest thickness in a first direction perpendicular to the light-emitting surface of the semiconductor light-emitting structure. The first refractive index is selected from a range of about 1.1 to about 1.5, and the second refractive index is selected from a range of about 2.0 to about 3.0.

20 Claims, 20 Drawing Sheets

(51) Int. Cl.
*H10H 29/80* (2025.01)
*H10H 29/851* (2025.01)

(56) References Cited

U.S. PATENT DOCUMENTS

| | | | | |
|---|---|---|---|---|
| 6,372,608 | B1 | 4/2002 | Shimoda et al. | |
| 6,645,830 | B2 | 11/2003 | Shimoda et al. | |
| RE38,466 | E | 3/2004 | Inoue et al. | |
| 6,818,465 | B2 | 11/2004 | Biwa et al. | |
| 6,818,530 | B2 | 11/2004 | Shimoda et al. | |
| 6,858,081 | B2 | 2/2005 | Biwa et al. | |
| 6,967,353 | B2 | 11/2005 | Suzuki et al. | |
| 7,002,182 | B2 | 2/2006 | Okuyama et al. | |
| 7,084,420 | B2 | 8/2006 | Kim et al. | |
| 7,087,932 | B2 | 8/2006 | Okuyama et al. | |
| 7,154,124 | B2 | 12/2006 | Han et al. | |
| 7,190,524 | B2 * | 3/2007 | Grawert | G02B 5/0833 427/166 |
| 7,208,725 | B2 | 4/2007 | Sherrer et al. | |
| 7,288,758 | B2 | 10/2007 | Sherrer et al. | |
| 7,319,044 | B2 | 1/2008 | Han et al. | |
| 7,501,656 | B2 | 3/2009 | Han et al. | |
| 7,709,857 | B2 | 5/2010 | Kim et al. | |
| 7,759,140 | B2 | 7/2010 | Lee et al. | |
| 7,781,727 | B2 | 8/2010 | Sherrer et al. | |
| 7,790,482 | B2 | 9/2010 | Han et al. | |
| 7,888,691 | B2 | 2/2011 | Krames | |
| 7,940,350 | B2 | 5/2011 | Jeong | |
| 7,959,312 | B2 | 6/2011 | Yoo et al. | |
| 7,964,881 | B2 | 6/2011 | Choi et al. | |
| 7,985,976 | B2 | 7/2011 | Choi et al. | |
| 7,994,525 | B2 | 8/2011 | Lee et al. | |
| 8,008,683 | B2 | 8/2011 | Choi et al. | |
| 8,013,352 | B2 | 9/2011 | Lee et al. | |
| 8,049,161 | B2 | 11/2011 | Sherrer et al. | |
| 8,129,711 | B2 | 3/2012 | Kang et al. | |
| 8,179,938 | B2 | 5/2012 | Kim | |
| 8,263,987 | B2 | 9/2012 | Choi et al. | |
| 8,324,646 | B2 | 12/2012 | Lee et al. | |
| 8,399,944 | B2 | 3/2013 | Kwak et al. | |
| 8,432,511 | B2 | 4/2013 | Jeong | |
| 8,459,832 | B2 | 6/2013 | Kim | |
| 8,502,242 | B2 | 8/2013 | Kim | |
| 8,536,604 | B2 | 9/2013 | Kwak et al. | |
| 8,704,254 | B2 | 4/2014 | Trottier et al. | |
| 8,735,931 | B2 | 5/2014 | Han et al. | |
| 8,766,295 | B2 | 7/2014 | Kim | |
| 8,815,629 | B2 * | 8/2014 | Surana | H10H 20/814 257/97 |
| 8,957,439 | B2 | 2/2015 | Bechtel et al. | |
| 10,243,124 | B2 | 3/2019 | Yuasa et al. | |
| 10,522,725 | B2 | 12/2019 | Guo et al. | |
| 10,566,318 | B2 | 2/2020 | Lee et al. | |
| 10,608,150 | B2 | 3/2020 | Yuasa et al. | |
| 11,031,527 | B2 * | 6/2021 | Check | H10H 20/034 |
| 11,456,401 | B2 | 9/2022 | Hong et al. | |
| 2006/0208268 | A1 | 9/2006 | Ueno et al. | |
| 2010/0085758 | A1 | 4/2010 | Takahashi et al. | |
| 2012/0307369 | A1 * | 12/2012 | Banerjee | G02B 5/286 703/1 |
| 2014/0077240 | A1 * | 3/2014 | Roucka | H10F 77/40 257/432 |
| 2014/0093661 | A1 | 4/2014 | Trajkovska et al. | |
| 2014/0264412 | A1 * | 9/2014 | Yoon | H10H 20/841 257/98 |
| 2015/0108491 | A1 * | 4/2015 | Lu | H10H 20/851 257/98 |
| 2017/0005242 | A1 * | 1/2017 | Kim | H10H 20/841 |
| 2018/0040775 | A1 * | 2/2018 | Wakamatsu | H10H 20/841 |
| 2019/0325791 | A1 * | 10/2019 | Lin | G02B 5/0242 |
| 2020/0284401 | A1 * | 9/2020 | Lenef | H01S 5/0087 |
| 2020/0357312 | A1 * | 11/2020 | Lin | G02B 5/201 |
| 2022/0165923 | A1 | 5/2022 | Kamp et al. | |
| 2022/0293819 | A1 * | 9/2022 | Li | H10H 20/82 |
| 2024/0170610 | A1 * | 5/2024 | Cho | H10H 20/841 |
| 2024/0395979 | A1 * | 11/2024 | Wiesmann | H10H 20/851 |

FOREIGN PATENT DOCUMENTS

| | | | |
|---|---|---|---|
| KR | 10-1288367 | B1 | 7/2013 |
| WO | 2016/088988 | A1 | 6/2016 |

* cited by examiner

LIGHT-EMITTING DEVICE

CROSS-REFERENCE TO RELATED APPLICATION

This application is based on and claims priority to Korean Patent Application No. 10-2023-0017575, filed on Feb. 9, 2023, in the Korean Intellectual Property Office, the disclosure of which is incorporated herein by reference in its entirety.

BACKGROUND

The present disclosure relates to a light-emitting device, and more particularly, to a semiconductor light-emitting device including a wavelength conversion layer.

Semiconductor light-emitting devices are widely used as light sources, and may be implemented in illumination devices or display devices. Various attempts have been made to implement the emission of intended colors by converting at least a portion of light, which has a first wavelength and is emitted from semiconductor light-emitting structures, into light having a second wavelength that is different from the first wavelength.

SUMMARY

One or more example embodiments provide a light-emitting device capable of precisely controlling an intended emission color thereof and improving the luminous flux thereof to improve the luminous efficiency thereof.

According to an aspect of an example embodiment, a light-emitting device includes: a semiconductor light-emitting structure configured to emit light having a first wavelength through a light-emitting surface; a wavelength conversion layer facing the light-emitting surface and configured to convert at least a portion of the light which has the first wavelength into light having a second wavelength that is greater than the first wavelength; and a multi-inorganic-film coating layer spaced apart from the light-emitting surface with the wavelength conversion layer therebetween, the multi-inorganic-film coating layer being configured to simultaneously transmit both a portion of the light having the first wavelength and a portion of the light having the second wavelength, which are incident from the wavelength conversion layer. The multi-inorganic-film coating layer includes a distributed Bragg reflector (DBR) structure including a plurality of inorganic films, in which a first inorganic film having a first refractive index and a second inorganic film having a second refractive index are alternately stacked, and an uppermost inorganic film farthest from the wavelength conversion layer from among the plurality of inorganic films has a greatest thickness in a first direction perpendicular to the light-emitting surface of the semiconductor light-emitting structure. The first refractive index is selected from a range of about 1.1 to about 1.5 and the second refractive index is selected from a range of about 2.0 to about 3.0.

According to another aspect of an example embodiment, a light-emitting device includes: a semiconductor light-emitting structure configured to emit light having a first wavelength selected from a range of about 400 nm to about 500 nm through a light-emitting surface; a wavelength conversion layer facing the light-emitting surface and including a plurality of phosphors, the plurality of phosphors being configured to be excited by the light having the first wavelength and emit light having a second wavelength, which is greater than the first wavelength and selected from a range of about 500 nm to about 800 nm; and a multi-inorganic-film coating layer spaced apart from the light-emitting surface with the wavelength conversion layer therebetween, the multi-inorganic-film coating layer being configured to simultaneously transmit both a portion of the light having the first wavelength and a portion of the light having the second wavelength, which are incident from the wavelength conversion layer. The multi-inorganic-film coating layer includes a plurality of inorganic films, in which a first inorganic film having a first refractive index and a second inorganic film having a second refractive index are alternately stacked, and an uppermost inorganic film exposed to the outside of the light-emitting device from among the plurality of inorganic films has a greatest thickness among the plurality of inorganic films in a first direction perpendicular to the light-emitting surface of the semiconductor light-emitting structure. The first refractive index is selected from a range of about 1.1 to about 1.5 and the second refractive index is selected from a range of about 2.0 to about 3.0.

According to yet another aspect of an example embodiment, a light-emitting device includes: a package substrate; a semiconductor light-emitting structure provided on the package substrate and configured to emit light having a first wavelength selected from a range of about 400 nm to about 500 nm through a light-emitting surface; a wavelength conversion layer facing the light-emitting surface, and including a glass matrix and a plurality of phosphors dispersed in the glass matrix, the plurality of phosphors including α-SiAlON represented by $Ca_xEu_ySi_{12-m-n}Al_{m+n}O_nN_{16-n}$ (where $0.25 \leq x \leq 2.00$, $0.001 \leq y \leq 0.100$, $0.001 \leq n \leq 11.490$, and $0.51 \leq m+n \leq 11.99$); a multi-inorganic-film coating layer spaced apart from the light-emitting surface with the wavelength conversion layer therebetween, the multi-inorganic-film coating layer being configured to simultaneously transmit both a portion of the light having the first wavelength and a portion of the light having the second wavelength; and a reflective resin layer arranged on the package substrate, a sidewall of the semiconductor light-emitting structure, a portion of a lower surface of the wavelength conversion layer, which faces the package substrate, and a sidewall of each of the wavelength conversion layer and the multi-inorganic-film coating layer. The multi-inorganic-film coating layer includes a plurality of inorganic films, in which a first inorganic film having a first refractive index and a second inorganic film having a second refractive index are alternately stacked, and an uppermost inorganic film that is externally exposed to outside the light-emitting device from among the plurality of inorganic films has a greatest thickness among the plurality of inorganic films in a first direction perpendicular to the light-emitting surface of the semiconductor light-emitting structure. An upper surface of the multi-inorganic-film coating layer and an upper surface of the reflective resin layer are coplanar with each other to provide a flat surface. The first refractive index is selected from a range of about 1.1 to about 1.5 and the second refractive index is selected from a range of about 2.0 to about 3.0.

BRIEF DESCRIPTION OF DRAWINGS

The above and other aspects and features will be more apparent from the following description of example embodiments, taken in conjunction with the accompanying drawings, in which.

DETAILED DESCRIPTION

Figure 1A:
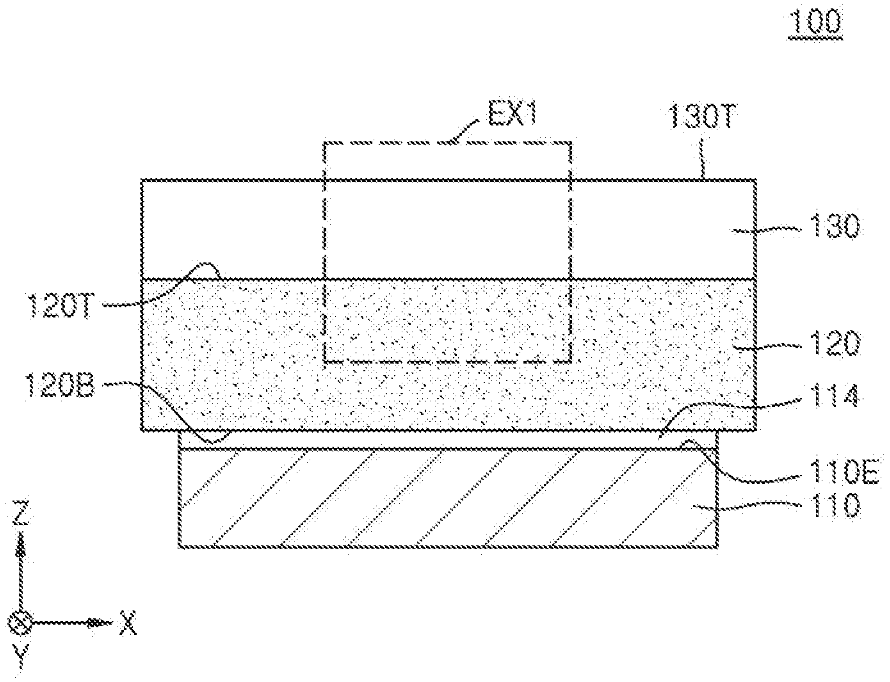
FIG. 1A is a schematic cross-sectional view of a light-emitting device according to some example embodiments.

Hereinafter, embodiments will be described in detail with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being “on,” “connected to” or “coupled to” another element or layer, it can be directly on, connected or coupled to the other element or layer, or intervening elements or layers may be present. By contrast, when an element is referred to as being “directly on,” “directly connected to” or “directly coupled to” another element or layer, there are no intervening elements or layers present. As used herein, the term “and/or” includes any and all combinations of one or more of the associated listed items. Expressions such as “at least one of,” when preceding a list of elements, modify the entire list of elements and do not modify the individual elements of the list. For example, the expression, “at least one of a, b, and c,” should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation. Like components are denoted by like reference numerals throughout the specification, and repeated descriptions thereof are omitted.

Figure 1B:
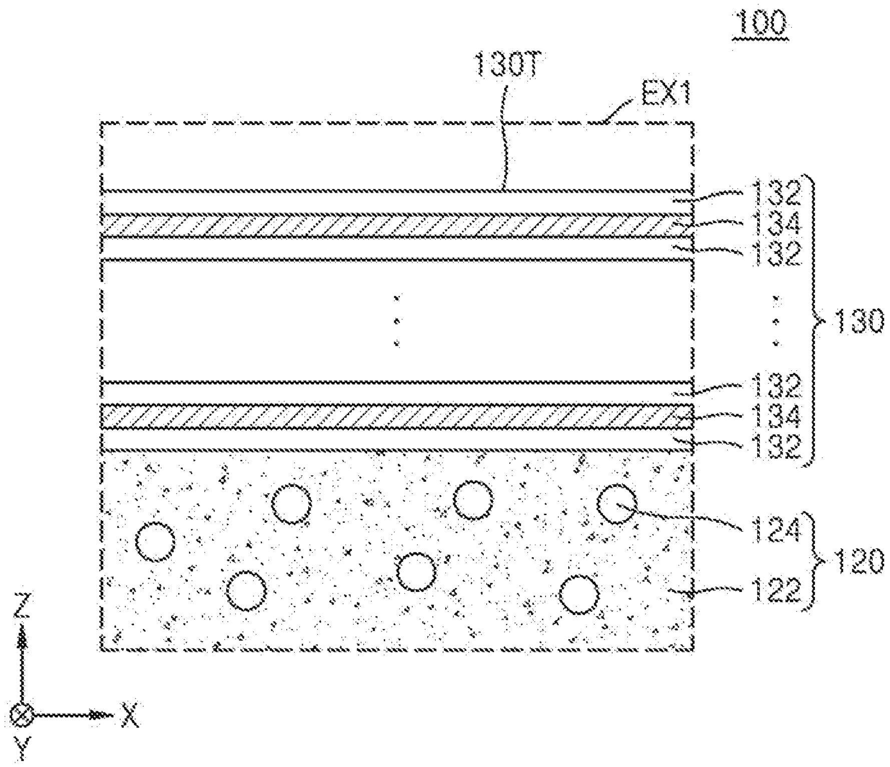
FIG. 1B is an enlarged cross-sectional view of a region EX1 of FIG. 1A.

FIG. 1A is a schematic cross-sectional view of a light-emitting device 100 according to some example embodiments. FIG. 1B is an enlarged cross-sectional view of a region EX1 of FIG. 1A.

Referring to FIGS. 1A and 1B, the light-emitting device 100 may include a semiconductor light-emitting structure 110, a wavelength conversion layer 120, which is arranged over the semiconductor light-emitting structure 110 to face a light-emitting surface 110E of the semiconductor light-emitting structure 110, and a multi-inorganic-film coating layer 130 arranged on the wavelength conversion layer 120. A bonding layer 114 may be arranged between the semiconductor light-emitting structure 110 and the wavelength conversion layer 120.

The semiconductor light-emitting structure 110 may include at least one light source. The at least one light source may include a light-emitting diode. In some example embodiments, the semiconductor light-emitting structure 110 may include one light-emitting diode. In some example embodiments, the semiconductor light-emitting structure 110 may include a plurality of light-emitting diodes.

In some example embodiments, the semiconductor light-emitting structure 110 may include a first conductivity-type semiconductor layer, an active layer, and a second conductivity-type semiconductor layer, which are stacked in the stated order in a direction (−Z direction) away from the wavelength conversion layer 120 based on the vertical direction (Z direction). Each of the first conductivity-type semiconductor layer, the active layer, and the second conductivity-type semiconductor layer may include a nitride semiconductor, and the semiconductor light-emitting structure 110 may include a nitride light-emitting structure. In some example embodiments, the first conductivity-type semiconductor layer closer to the wavelength conversion layer 120, out of the first conductivity-type semiconductor layer and the second conductivity-type semiconductor layer, may include a nitride semiconductor satisfying n-type $In_xAl_yGa_{1-x-y}N$ ($0\le x<1$, $0\le y<1$, and $0\le x+y<1$). The first conductivity-type semiconductor layer may include silicon (Si) or carbon (C) as an n-type dopant. For example, the first conductivity-type semiconductor layer may include an n-type GaN layer. The second conductivity-type semiconductor layer may include a nitride semiconductor satisfying p-type $In_xAl_yGa_{1-x-y}N$ ($0\le x<1$, $0\le y<1$, and $0\le x+y<1$). The second conductivity-type semiconductor layer may include magnesium (Mg) or zinc (Zn) as a p-type dopant. In some example embodiments, each of the first conductivity-type semiconductor layer and the second conductivity-type semiconductor layer may include a semiconductor layer that is based on AlGaInP or AlInGaAs. Each of the first conductivity-type semiconductor layer and the second conductivity-type semiconductor layer may include a single layer or may include a plurality of layers that are different from each other in terms of characteristics, such as a doping concentration and composition. The active layer may emit light having certain energy due to the recombination of an electron and a hole. The active layer may have a single quantum well (SQW) or multiple-quantum well (MQW) structure, in which a quantum well layer and a quantum barrier layer are alternately arranged one-by-one. In some example embodiments, the quantum well layer and the quantum barrier layer may include $Al_xGa_yIn_{1-x-y}P$ ($0 \leq x \leq 1$, $0 \leq y \leq 1$, and $0 \leq x+y \leq 1$) having different compositions from each other. For example, the quantum well layer may include $In_xGa_{1-x}N$ ($0<x \leq 1$) and the quantum barrier layer may include GaN or AlGaN, but example embodiments are not limited thereto.

The light-emitting surface 110E of the semiconductor light-emitting structure 110 may include a surface of the first conductivity-type semiconductor layer. To improve the light extraction efficiency of the light-emitting device 100, the light-emitting surface 110E of the semiconductor light-emitting structure 110 may include an uneven surface having a plurality of uneven portions. For example, the uneven surface may have a level which varies along the Z direction. Each of the plurality of uneven portions may have various sizes and shapes.

The semiconductor light-emitting structure 110 may be configured to emit light in a blue wavelength range. In some example embodiments, the semiconductor light-emitting structure 110 may be configured to emit light having a first wavelength selected from a range of about 400 nm to about 500 nm, for example, a range of about 425 nm to about 475 nm. The light may be emitted toward the wavelength conversion layer 120. In an example, a nominal wavelength of light emitted from the semiconductor light-emitting structure 110 may be in a range of about 430 nm to about 470 nm. The nominal wavelength may also be referred to as a target wavelength or a central wavelength. However, example embodiments are not limited thereto. For example, the nominal wavelength of light emitted from the semiconductor light-emitting structure 110 may be in any region selected from a range of about 400 nm to about 500 nm.

The wavelength conversion layer 120 may be configured to convert a portion of light, which has a first wavelength and is emitted from the semiconductor light-emitting structure 110, into light having a second wavelength that is greater than the first wavelength. The wavelength conversion layer 120 may include a glass-phosphor composite, which includes a glass matrix 122 and a plurality of phosphors 124 dispersed in the glass matrix 122. In some example embodiments, the plurality of phosphors 124 may be configured to be excited by light, which has the first wavelength and is emitted from the semiconductor light-emitting structure 110, and to emit light having a wavelength that is greater than the first wavelength and selected from a range of about 500 nm to about 800 nm, for example, a range of about 580 nm to about 620 nm. A nominal wavelength of light emitted from the plurality of phosphors 124 may be in any region selected from a range of about 500 nm to about 800 nm.

In some example embodiments, the plurality of phosphors 124 may be present in an amount of about 10% by weight (wt %) to about 40 wt %, for example, about 25 wt % to about 32 wt %, in the wavelength conversion layer 120, based on the total weight of the wavelength conversion layer 120.

The wavelength conversion layer 120 may include the glass-phosphor composite, which includes the plurality of phosphors 124 dispersed in the glass matrix 122, and thus have excellent heat resistance. The wavelength conversion layer 120 may have an upper surface 120T, which is in contact with the multi-inorganic-film coating layer 130, and a lower surface 120B that is opposite to the upper surface 120T. The lower surface 120B of the wavelength conversion layer 120 may face the light-emitting surface 110E of the semiconductor light-emitting structure 110 and may be apart from the light-emitting surface 110E of the semiconductor light-emitting structure 110 with the bonding layer 114 therebetween. The bonding layer 114 may include, but is not limited to, a curable resin material, such as silicone.

The planar shape, planar size, and thickness of the wavelength conversion layer 120 may be appropriately selected depending on the planar shape, planar size, and thickness of the semiconductor light-emitting structure 110. For example, when viewing a plane (for example, the X-Y plane), each of the semiconductor light-emitting structure 110 and the wavelength conversion layer 120 may have a rectangular shape. In a first horizontal direction (X direction) and a second horizontal direction (Y direction), the width of each of the wavelength conversion layer 120 and the multi-inorganic-film coating layer 130 may be greater than the width of the semiconductor light-emitting structure 110. That is, in a direction (for example, the X direction and the Y direction) parallel to an extension direction of the lower surface 120B of the wavelength conversion layer 120, the width of each of the wavelength conversion layer 120 and the multi-inorganic-film coating layer 130 may be greater than the width of the semiconductor light-emitting structure 110. Therefore, each of the wavelength conversion layer 120 and the multi-inorganic-film coating layer 130 may protrude outward (i.e., past) from the semiconductor light-emitting structure 110 around the light-emitting surface 110E of the semiconductor light-emitting structure 110. The wavelength conversion layer 120 may have a thickness selected from a range of about 30 μm to about 300 μm, for example, about 95 μm to about 200 μm, in a direction perpendicular to the light-emitting surface 110E of the semiconductor light-emitting structure 110 (which is referred to as the vertical direction (Z direction) hereinafter). When the thickness of the wavelength conversion layer 120 is too high, fluorescence emission efficiency may be reduced due to excessive light scattering and light absorption of the wavelength conversion layer 120. When the thickness of the wavelength conversion layer 120 is too low, it may be difficult to obtain intended luminous intensity, or the mechanical strength of the wavelength conversion layer 120 may be reduced.

The glass matrix 122 of the wavelength conversion layer 120 may be a resulting product obtained by molding and sintering glass powder. The glass matrix 122 may maintain the plurality of phosphors 124 dispersed in the glass matrix 122 in a stable and uniformly dispersed state. In some example embodiments, the glass matrix 122 may include a resulting product obtained by sintering glass powder including $P_2O_5$, ZnO, $SiO_2$, and $B_2O_3$ as main components. For example, the glass powder may include about 2 mol % to about 10 mol % of $P_2O_5$, about 30 mol % to about 50 mol % of ZnO, about 10 mol % to about 25 mol % of $SiO_2$, and about 15 mol % to about 25 mol % of $B_2O_3$, based on the total weight of the glass powder. In some example embodiments, the glass matrix 122 may further include, but is not limited to, $Al_2O_3$, $SnO_2$, BaO, SrO, CaO, $Li_2O$, $Na_2O$, $K_2O$, or a combination thereof. In some example embodiments, the glass matrix 122 may have, but is not limited to, a refractive index of about 1.44 to about 1.89, for example, about 1.60 to about 1.84.

In the wavelength conversion layer 120, the plurality of phosphors 124 may be dispersed at a uniform concentration in the glass matrix 122. The plurality of phosphors 124 of the wavelength conversion layer 120 may include α-SiAlON represented by Formula 1.

$$Ca_xEu_ySi_{12-m-n}Al_{m+n}O_nN_{16-n} \quad \text{[Formula 1]}$$

In Formula 1, $0.25 \le x \le 2.00$, $0.001 \le y \le 0.100$, $0.001 \le n \le 11.490$, and $0.51 \le m+n \le 11.99$.

The multi-inorganic-film coating layer 130 may be spaced apart from the semiconductor light-emitting structure 110 with the wavelength conversion layer 120 therebetween to face the light-emitting surface 110E of the semiconductor light-emitting structure 110. The multi-inorganic-film coating layer 130 may be configured to simultaneously transmit a portion of light having the first wavelength and a portion of light having the second wavelength, which are incident from the wavelength conversion layer 120.

As shown in FIG. 1B, the multi-inorganic-film coating layer 130 may include a distributed Bragg reflector (DBR) structure including a plurality of inorganic films (e.g., 132 and 134), in which a first inorganic film 132 having a first refractive index selected from a range of about 1.1 to about 1.5 and a second inorganic film 134 having a second refractive index selected from a range of about 2.0 to about 3.0 are alternately stacked one-by-one. In some example embodiments, the total number of first inorganic films 132 and second inorganic films 134, which are included in the plurality of inorganic films 132 and 134 constituting the multi-inorganic-film coating layer 130, may be 3 to 20, for example, 3 to 7, but example embodiments are not limited thereto.

In the multi-inorganic-film coating layer 130, among the plurality of inorganic films 132 and 134, a lowermost inorganic film, which is closest to the wavelength conversion layer 120, and an uppermost inorganic film, which is farthest from the wavelength conversion layer 120, may each include the first inorganic film 132. A lower surface of the multi-inorganic-film coating layer 130, which faces the semiconductor light-emitting structure 110, may be in direct contact with the upper surface 120T of the wavelength conversion layer 120. An upper surface 130T of the multi-inorganic-film coating layer 130 may be exposed to the outside of the light-emitting device 100.

A lower surface of the first inorganic film 132 closest to the wavelength conversion layer 120 from among a plurality of first inorganic films 132 may constitute the lower surface of the multi-inorganic-film coating layer 130 and may be in direct contact with the wavelength conversion layer 120. An upper surface of the first inorganic film 132 farthest from the wavelength conversion layer 120 from among the plurality of first inorganic films 132 may constitute the upper surface 130T of the multi-inorganic-film coating layer 130 and may be exposed to the outside of the light-emitting device 100. In the multi-inorganic-film coating layer 130, the first inorganic film 132, which is uppermost among the plurality of inorganic films 132 and 134 and exposed to the outside of the light-emitting device 100, may have the greatest thickness in the vertical direction (Z direction) among the plurality of inorganic films 132 and 134. In some example embodiments, the thickness of the multi-inorganic-film coating layer 130 in the vertical direction (Z direction) may be, but is not limited to, about 200 nm to about 1000 nm, for example, about 300 nm to about 700 nm, or about 300 nm to about 500 nm.

In some example embodiments, the multi-inorganic-film coating layer 130 may include the plurality of first inorganic films 132, and each of the plurality of first inorganic films 132 may include $SiO_2$, $MgF_2$, $BaF_2$, $CaF_2$, CsF, or a combination thereof. The multi-inorganic-film coating layer 130 may include a plurality of second inorganic films 134, and each of the plurality of second inorganic films 134 may include $TiO_2$, $ZrO_2$, ZnO, $WO_3$, or a combination thereof. In the multi-inorganic-film coating layer 130, the plurality of first inorganic films 132 and the plurality of second inorganic films 134 may respectively have different thicknesses from each other in the vertical direction (Z direction). Among the plurality of second inorganic films 134, the second inorganic film 134 closest to the wavelength conversion layer 120 may have the greatest thickness in the vertical direction (Z direction).

In some example embodiments, the multi-inorganic-film coating layer 130 may be configured to simultaneously transmit both a portion of light, which is emitted from the wavelength conversion layer 120 and has the first wavelength selected from a range of about 400 nm to about 500 nm, for example, a range of about 425 nm to about 475 nm, and a portion of light, which is emitted from the wavelength conversion layer 120 and has the second wavelength selected from a range of about 500 nm to about 800 nm, for example, a range of about 580 nm to about 620 nm. Herein, light having the first wavelength may be referred to as blue-region light and light having the second wavelength may be referred to as a yellow, amber, or orange-region light.

In some example embodiments, the multi-inorganic-film coating layer 130 may be configured to reflect about 30% to about 95% of light having the first wavelength, transmit about 5% to about 60% of light having the first wavelength, and transmit a portion of light having the second wavelength, the light having the first wavelength being incident from the wavelength conversion layer 120 onto the multi-inorganic-film coating layer 130. For example, the multi-inorganic-film coating layer 130 may be configured to transmit about 20% to about 40% of light having the second wavelength, which is incident from the wavelength conversion layer 120 onto the multi-inorganic-film coating layer 130.

In the light-emitting device 100, light emitted from the multi-inorganic-film coating layer 130 may correspond to one color coordinate, which has a Cx value selected from a range of about 0.53 to about 0.60 and a Cy value selected from a range of about 0.40 to about 0.47 based on the Commission Internationale de l'Eclairage (CIE) color coordinates. In some example embodiments, light emitted from the light-emitting device 100 may correspond to one color coordinate, which has a Cx value selected from a range of about 0.55 to about 0.58 and a Cy value selected from a range of about 0.41 to about 0.43 based on the CIE color coordinates.

The light-emitting device 100 described with reference to FIGS. 1A and 1B includes the multi-inorganic-film coating layer 130 which faces the light-emitting surface 110E of the semiconductor light-emitting structure 110 with the wavelength conversion layer 120 therebetween. The multi-inorganic-film coating layer 130 may be configured to cut off a portion of light, which is incident from the wavelength conversion layer 120 and has a first wavelength selected from a range of about 400 nm to about 500 nm, and simultaneously transmit, at a controlled ratio, another portion of light having the first wavelength and a portion of light emitted from the wavelength conversion layer 120 and having a second wavelength, which is greater than the first wavelength and selected from a range of about 500 nm to about 800 nm. Therefore, according to the light-emitting device 100, an intended emission color may be precisely controlled by selectively controlling the transmittance of each of light having the first wavelength and light having the second wavelength, which are emitted from the semiconductor light-emitting structure 110, and the degree of freedom of selecting the wavelength of the emission color may improve even without a complicated structural change of the light-emitting device 100. For example, the transmittance of each of light having the first wavelength and light having the second wavelength may be controlled by modifying the total number of first inorganic films 132 and second inorganic films 134 provided in the multi-inorganic-film coating layer 130. For example, the transmittance of each of light having the first wavelength and light having the second wavelength may be controlled by modifying thicknesses of the first and second inorganic films 132 and 134 provided in the multi-inorganic-film coating layer 130. For example, the transmittance of each of light having the first wavelength and light having the second wavelength may be controlled by modifying materials of the first and second inorganic films 132 and 134 provided in the multi-inorganic-film coating layer 130. For example, the transmittance of each of light having the first wavelength and light having the second wavelength may be controlled by modifying any combination of the total number of first inorganic films 132 and second inorganic films 134 provided in the multi-inorganic-film coating layer 130, thicknesses of the first and second inorganic films 132 and 134 provided in the multi-inorganic-film coating layer 130, and materials of the first and second inorganic films 132 and 134 provided in the multi-inorganic-film coating layer 130. In addition, the fabrication cost of the light-emitting device 100 may be reduced by reducing the amount of a material for light wavelength conversion, for example, the phosphors 124 in the wavelength conversion layer 120, and the luminous efficiency of the light-emitting device 100 may be improved by improving the luminous flux of the light-emitting device 100.

Figure 2:
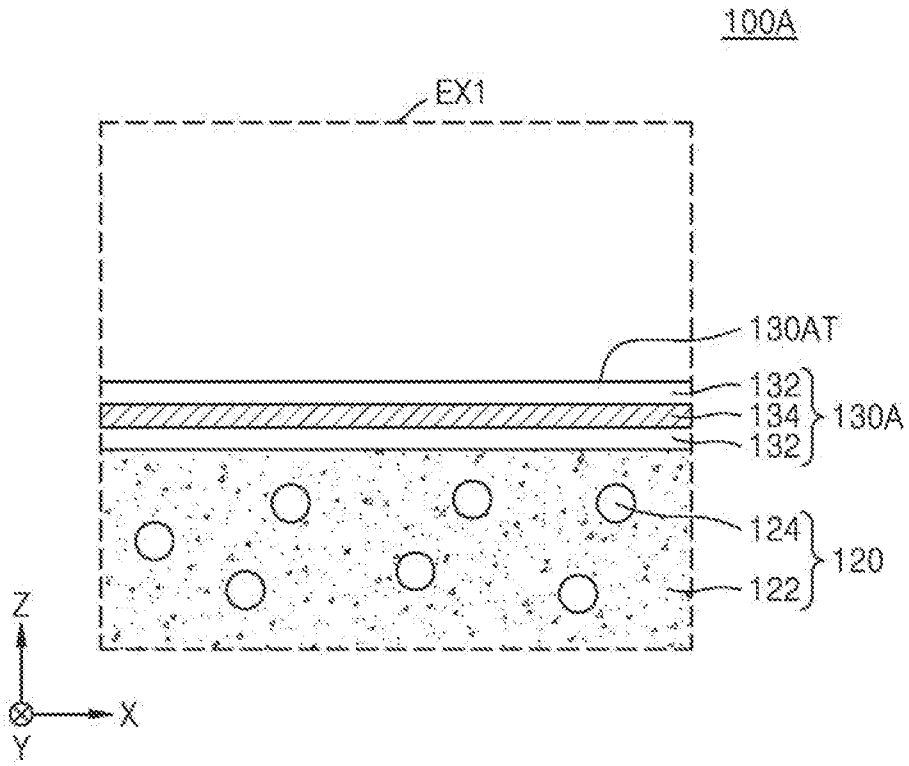
FIG. 2 is a schematic cross-sectional view of a light-emitting device according to some example embodiments.

FIG. 2 is a schematic cross-sectional view of a light-emitting device 100A according to some example embodiments. FIG. 2 illustrates an enlarged cross-sectional configuration of a region of the light-emitting device 100A, which corresponds to the region EX1 of FIG. 1A. In FIG. 2, the same reference numerals as in FIGS. 1A and 1B respectively denote the same members, and here, repeated descriptions thereof are omitted.

Referring to FIG. 2, the light-emitting device 100A may have substantially the same configuration and effect as the light-emitting device 100 described with reference to FIGS. 1A and 1B. However, the light-emitting device 100A may include a multi-inorganic-film coating layer 130A arranged on the wavelength conversion layer 120. The multi-inorganic-film coating layer 130A may have substantially the same configuration and effect as the multi-inorganic-film coating layer 130 described with reference to FIGS. 1A and 1B. However, the multi-inorganic-film coating layer 130A includes only three inorganic films. The three inorganic films may include the first inorganic film 132 at the lowermost position, the second inorganic film 134, and the first inorganic film 132 at the uppermost position, which are stacked in the stated order on the wavelength conversion layer 120. In the vertical direction (Z direction), the respective thicknesses of the first inorganic film 132 at the lowermost position, the second inorganic film 134, and the first inorganic film 132 at the uppermost position may be different from each other. The thickness of the first inorganic film 132 at the uppermost position may be greater in the vertical direction (Z direction) than the thickness of the first inorganic film 132 at the lowermost position. An upper surface of the first inorganic film 132 at the uppermost position may constitute an upper surface 130AT of the multi-inorganic-film coating layer 130A, and the upper surface 130AT of the multi-inorganic-film coating layer 130A may be exposed to the outside of the light-emitting device 100A. More detailed configurations of the first inorganic film 132 and the second inorganic film 134, which are included in the multi-inorganic-film coating layer 130A, are the same as described with reference to FIGS. 1A and 1B.

Figure 3:
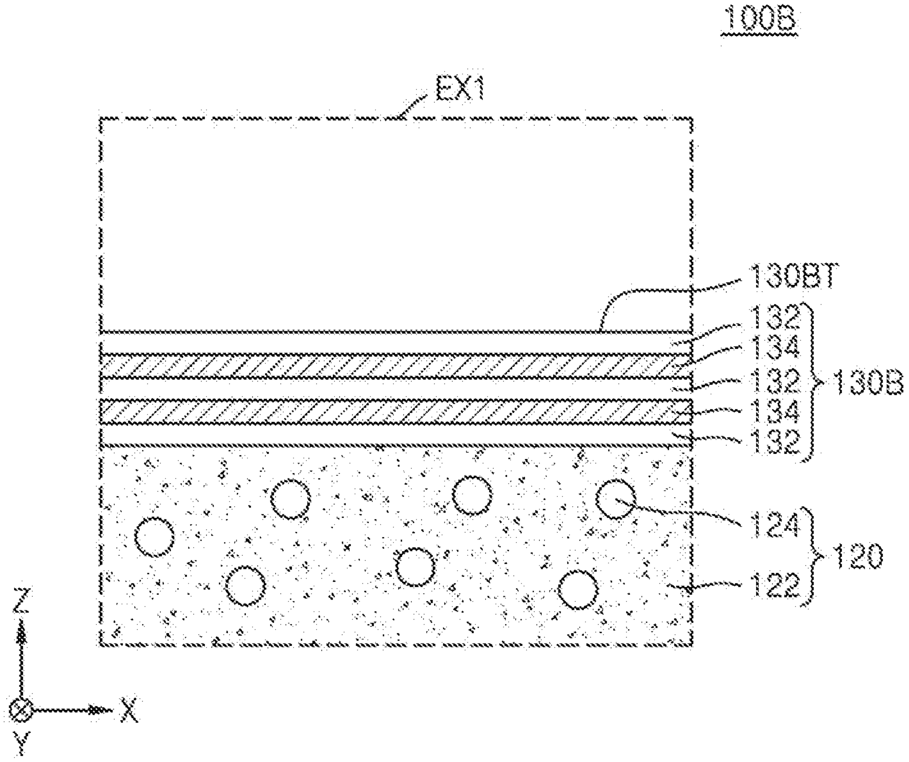
FIG. 3 is a schematic cross-sectional view of a light-emitting device according to some example embodiments.

FIG. 3 is a schematic cross-sectional view of a light-emitting device 100B according to some example embodiments. FIG. 3 illustrates an enlarged cross-sectional configuration of a region of the light-emitting device 100B, which corresponds to the region EX1 of FIG. 1A. In FIG. 3, the same reference numerals as in FIGS. 1A and 1B respectively denote the same members, and here, repeated descriptions thereof are omitted.

Referring to FIG. 3, the light-emitting device 100B may have substantially the same configuration and effect as the light-emitting device 100 described with reference to FIGS. 1A and 1B. The light-emitting device 100B may include a multi-inorganic-film coating layer 130B arranged on the wavelength conversion layer 120. The multi-inorganic-film coating layer 130B may have substantially the same configuration and effect as the multi-inorganic-film coating layer 130 described with reference to FIGS. 1A and 1B. However, the multi-inorganic-film coating layer 130B includes only five inorganic films. The five inorganic films may include three first inorganic films 132 and two second inorganic films 134, and the three first inorganic films 132 and the two second inorganic films 134 may be alternately arranged one-by-one on the wavelength conversion layer 120.

In the vertical direction (Z direction), the respective thicknesses of the three first inorganic films 132 and the two second inorganic films 134 may be different from each other. In the three first inorganic films 132, the thickness of the first inorganic film 132 at the uppermost position may be greater in the vertical direction (Z direction) than the thickness of each of the remaining two first inorganic films 132. An upper surface of the first inorganic film 132 at the uppermost position may constitute an upper surface 130BT of the multi-inorganic-film coating layer 130B, and the upper surface 130BT of the multi-inorganic-film coating layer 130B may be exposed to the outside of the light-emitting device 100B. More detailed configurations of the first inorganic film 132 and the second inorganic film 134, which are included in the multi-inorganic-film coating layer 130B, are the same as described with reference to FIGS. 1A and 1B.

Figure 4:
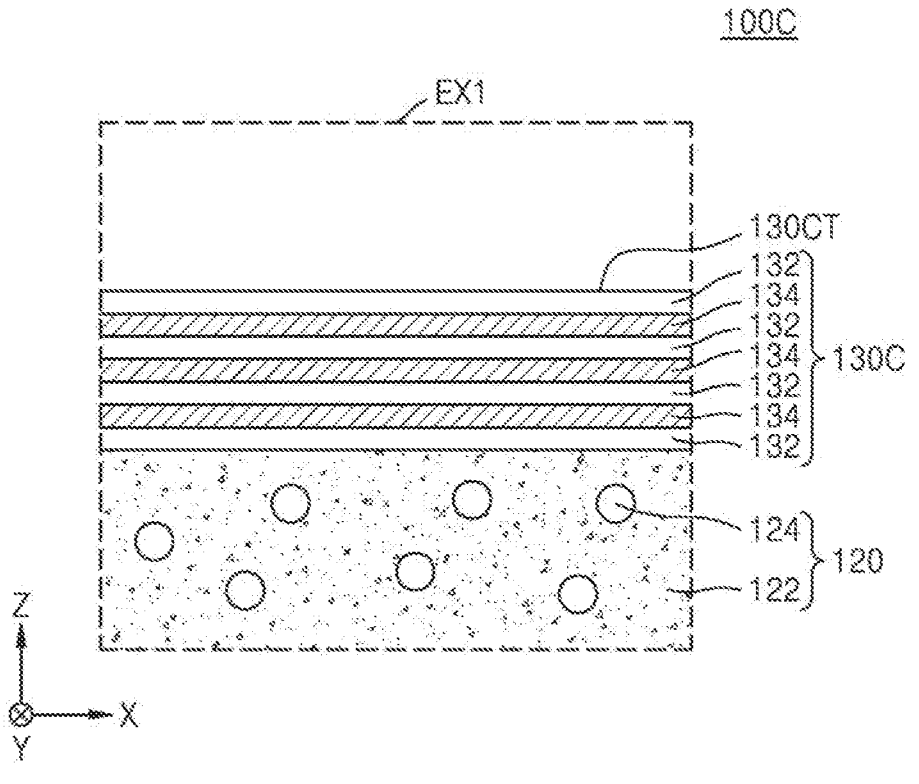
FIG. 4 is a schematic cross-sectional view of a light-emitting device according to some example embodiments.

FIG. 4 is a schematic cross-sectional view of a light-emitting device 100C according to some example embodiments. FIG. 4 illustrates an enlarged cross-sectional configuration of a region of the light-emitting device 100C, which corresponds to the region EX1 of FIG. 1A. In FIG. 4, the same reference numerals as in FIGS. 1A and 1B respectively denote the same members, and here, repeated descriptions thereof are omitted.

Referring to FIG. 4, the light-emitting device 100C may have substantially the same configuration and effect as the light-emitting device 100 described with reference to FIGS. 1A and 1B. The light-emitting device 100C may include a multi-inorganic-film coating layer 130C arranged on the wavelength conversion layer 120. The multi-inorganic-film coating layer 130C may have substantially the same configuration and effect as the multi-inorganic-film coating layer 130 described with reference to FIGS. 1A and 1B. However, the multi-inorganic-film coating layer 130C includes only seven inorganic films. The seven inorganic films may include four first inorganic films 132 and three second inorganic films 134, and the four first inorganic films 132 and the three second inorganic films 134 may be alternately arranged one-by-one on the wavelength conversion layer 120.

In the vertical direction (Z direction), the respective thicknesses of the four first inorganic films 132 and the three second inorganic films 134 may be different from each other. In the four first inorganic films 132, the thickness of the first inorganic film 132 at the uppermost position may be greater in the vertical direction (Z direction) than the thickness of each of the remaining three first inorganic films 132. An upper surface of the first inorganic film 132 at the uppermost position may constitute an upper surface 130CT of the multi-inorganic-film coating layer 130C, and the upper surface 130CT of the multi-inorganic-film coating layer 130C may be exposed to the outside of the light-emitting device 100C. More detailed configurations of the first inorganic film 132 and the second inorganic film 134, which are included in the multi-inorganic-film coating layer 130C, are the same as described with reference to FIGS. 1A and 1B.

Figure 5A:
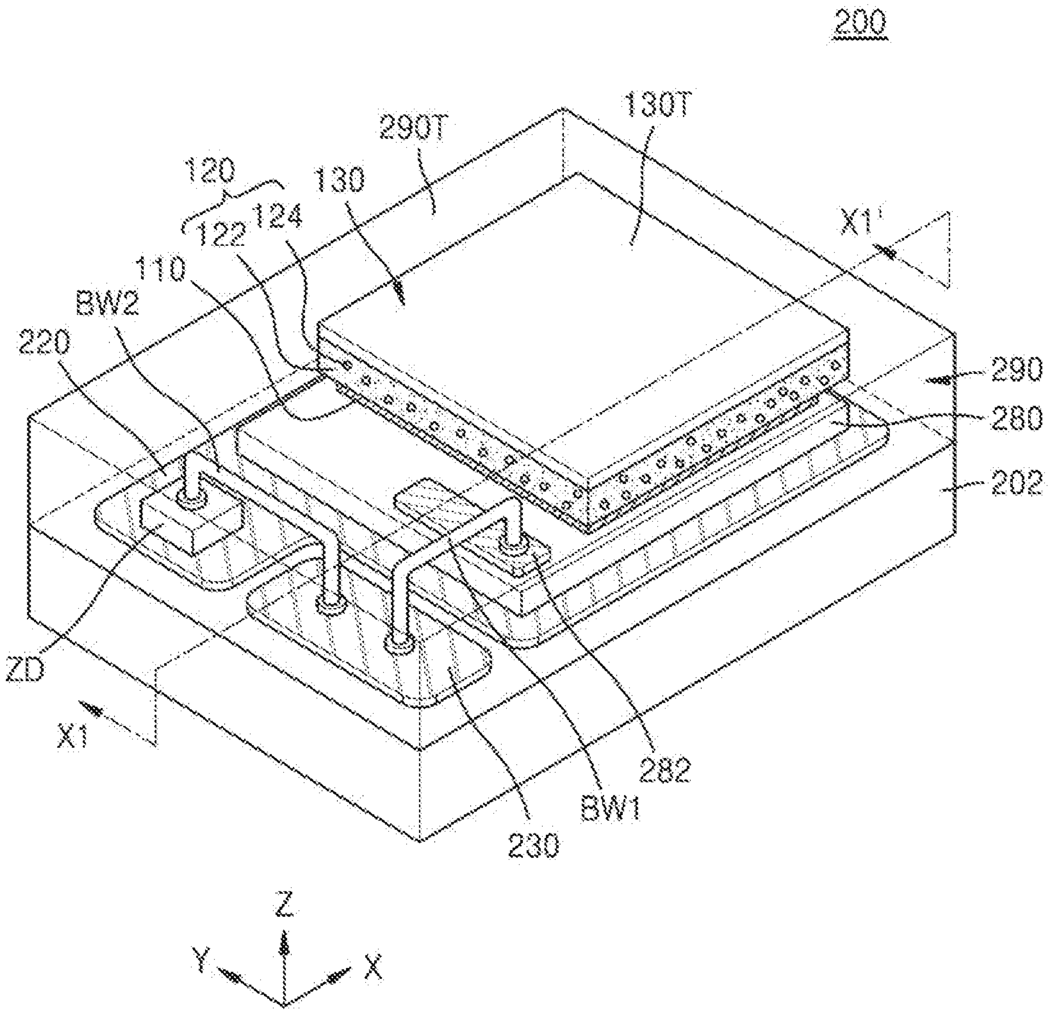
FIG. 5A is a schematic cross-sectional view of a light-emitting device according to some example embodiments.
Figure 5B:
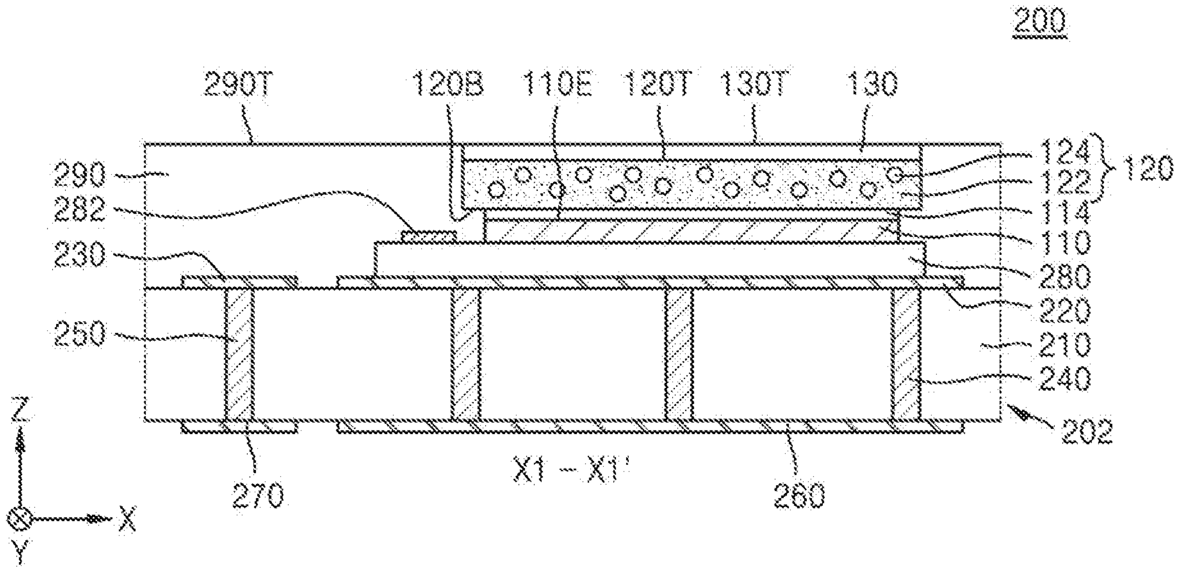
FIG. 5B is a cross-sectional view of the light-emitting device, taken along a line X1-X1' of FIG. 5A.

FIG. 5A is a schematic cross-sectional view of a light-emitting device 200 according to some example embodiments. FIG. 5B is a cross-sectional view of the light-emitting device 200, taken along a line X1-X1' of FIG. 5A. In FIGS. 5A and 5B, the same reference numerals as in FIGS. 1A and 1B respectively denote the same members, and here, repeated descriptions thereof are omitted.

Referring to FIGS. 5A and 5B, the light-emitting device 200 may include a package substrate 202, the semiconductor light-emitting structure 110 mounted over the package substrate 202, the wavelength conversion layer 120 arranged over the semiconductor light-emitting structure 110, the multi-inorganic-film coating layer 130 facing the semiconductor light-emitting structure 110 with the wavelength conversion layer 120 therebetween, the bonding layer 114 between the semiconductor light-emitting structure 110 and the wavelength conversion layer 120, and a reflective resin layer 290.

The reflective resin layer 290 may be arranged on the package substrate 202. The reflective resin layer 290 may cover a sidewall of each of the semiconductor light-emitting structure 110, the bonding layer 114, the wavelength conversion layer 120, and the multi-inorganic-film coating layer 130. The reflective resin layer 290 may include a portion that is in contact with a portion of the lower surface 120B of the wavelength conversion layer 120. Although, for the understanding of the respective components and the convenience of descriptions, FIG. 5A illustrates the reflective resin layer 290 as being transparent such that portions covered by the reflective resin layer 290 are viewed, the reflective resin layer 290 may include an opaque material. For example, the reflective resin layer 290 may include white silicone, epoxy, or a combination thereof. In some example embodiments, the reflective resin layer 290 may further include light-reflective particles, such as $TiO_2$, $Al_2O_3$, or the like. The reflective resin layer 290 may be formed by an injection molding process or a transfer molding process, but example embodiments are not limited thereto.

As shown in FIGS. 5A and 5B, the package substrate 202 may include a body 210, a first upper wiring layer 220 and a second upper wiring layer 230, which are arranged on an upper surface of the body 210, a first lower wiring layer 260 and a second lower wiring layer 270, which are arranged on a lower surface of the body 210, and a first through-via 240 and a second through-via 250, which pass through the body 210.

The package substrate 202 may be electrically connected with the semiconductor light-emitting structure 110 via the first upper wiring layer 220, the second upper wiring layer 230, and a first bonding wire BW1. In some example embodiments, the body 210 may include a ceramic substrate including AlN and the like. In some example embodiments, the package substrate 202 may include a substrate including a lead frame.

As shown in FIG. 5A, the semiconductor light-emitting structure 110 and a Zener diode ZD may be mounted on or over the first upper wiring layer 220 of the package substrate 202. The second upper wiring layer 230 may be electrically connected with the semiconductor light-emitting structure 110 via the first bonding wire BW1. The second upper wiring layer 230 may be electrically connected with the Zener diode ZD via a second bonding wire BW2. The Zener diode ZD may prevent over-current, which flows through the semiconductor light-emitting structure 110, and/or electrostatic discharge (ESD) due to a voltage applied to the semiconductor light-emitting structure 110. A conductive bonding layer may be arranged between the Zener diode ZD and the first upper wiring layer 220. The Zener diode ZD may be bonded onto the first upper wiring layer 220 via the conductive bonding layer. The conductive bonding layer may include conductive paste or a eutectic metal. In some example embodiments, the light-emitting device 200 may not include the Zener diode ZD and the second bonding wire BW2.

Each of the first and second bonding wires BW1 and BW2 may include gold (Au), silver (Ag), copper (Cu), lead (Pb), tin (Sn), aluminum (Al), or a combination thereof. Each of the first and second bonding wires BW1 and BW2 may be formed by a process of thermocompression bonding, ultrasonic bonding, and/or thermosonic bonding.

A substrate structure 280 may be arranged on the first upper wiring layer 220 of the package substrate 202. A stack structure, which includes the semiconductor light-emitting structure 110, the wavelength conversion layer 120, and the multi-inorganic-film coating layer 130, and a plurality of electrodes may be arranged on the substrate structure 280. More detailed configurations of the semiconductor light-emitting structure 110, the bonding layer 114, the wavelength conversion layer 120, and the multi-inorganic-film coating layer 130 are the same as described with reference to FIGS. 1A and 1B. The plurality of electrodes may include electrodes, which are connected with the semiconductor light-emitting structure 110, and an electrode pad 282, which is horizontally apart from the semiconductor light-emitting structure 110. The electrode pad 282 may be arranged between the substrate structure 280 and the first bonding wire BW1. Each of the plurality of electrodes, as well as the electrode pad 282, may include a single-layered structure or a multilayered structure. For example, each of the plurality of electrodes and the electrode pad 282 may include, but is not limited to, gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), an alloy thereof, or a combination thereof.

The substrate structure 280 may include a conductive structure. The substrate structure 280 may include a support substrate and a bonding metal layer, which are stacked in the stated order in the vertical direction (Z direction) on the first upper wiring layer 220. The support substrate may include a conductive substrate including a silicon (Si) substrate. The bonding metal layer may include gold (Au), tin (Sn), nickel (Ni), Au—Sn, Ni—Sn, or Ni—Au—Sn.

The reflective resin layer 290 may encapsulate a sidewall of the stack structure that includes the semiconductor light-emitting structure 110, the wavelength conversion layer 120, and the multi-inorganic-film coating layer 130. In the light-emitting device 200, the reflective resin layer 290 may cover a portion of the lower surface 120B of the wavelength conversion layer 120 around the semiconductor light-emitting structure 110, thereby further improving the light extraction efficiency and color distribution of the light-emitting device 200.

In the light-emitting device 200, the upper surface 130T of the multi-inorganic-film coating layer 130 and an upper surface 290T and sidewalls of the reflective resin layer 290 may be exposed to the outside of the light-emitting device 200. The upper surface 130T of the multi-inorganic-film coating layer 130 and the upper surface 290T of the reflective resin layer 290 may be coplanar with each other to provide a flat surface. Because the upper surface 120T of the wavelength conversion layer 120 is entirely covered by the multi-inorganic-film coating layer 130, the wavelength conversion layer 120 may not be exposed to the outside of the light-emitting device 200.

In the light-emitting device 200, light emitted from the multi-inorganic-film coating layer 130 may correspond to one color coordinate, which has a Cx value selected from a range of about 0.53 to about 0.60 and a Cy value selected from a range of about 0.40 to about 0.47 based on the CIE color coordinates. In some example embodiments, light emitted from the light-emitting device 200 may correspond to one color coordinate, which has a Cx value selected from a range of about 0.55 to about 0.58 and a Cy value selected from a range of about 0.41 to about 0.43 based on the CIE color coordinates.

Similar to the light-emitting device 100 described with reference to FIGS. 1A and 1B, the light-emitting device 200 described with reference to FIGS. 5A and 5B includes the multi-inorganic-film coating layer 130 facing the light-emitting surface 110E of the semiconductor light-emitting structure 110 with the wavelength conversion layer 120 therebetween. The multi-inorganic-film coating layer 130 may be configured to cut off a portion of light, which is incident from the wavelength conversion layer 120 and has a first wavelength selected from a range of about 400 nm to about 500 nm, and simultaneously transmit, at a controlled ratio, another portion of light having the first wavelength and a portion of light emitted from the wavelength conversion layer 120 and having a second wavelength, which is greater than the first wavelength and selected from a range of about 500 nm to about 800 nm. Therefore, according to the light-emitting device 200, an intended emission color may be precisely controlled by selectively controlling the transmittance of each of light having the first wavelength and light having the second wavelength, which are emitted from the semiconductor light-emitting structure 110, and the degree of freedom of selecting the wavelength of the emission color may improve even without a complicated structural change of the light-emitting device 200. In addition, the fabrication cost of the light-emitting device 200 may be reduced by reducing the amount of a material for light wavelength conversion, for example, the phosphors 124 in the wavelength conversion layer 120, and the luminous efficiency of the light-emitting device 200 may be improved by improving the luminous flux of the light-emitting device 200.

Evaluation Examples

To evaluate various characteristics of light-emitting devices according to example embodiments, a stack structure including a wavelength conversion layer, which has a thickness of 120 μm and includes phosphors including α-SiAlON represented by Formula 1, and a multi-inorganic-film coating layer, which is arranged on the wavelength conversion layer and has various configurations, was bonded onto a semiconductor light-emitting structure configured to emit blue light having a wavelength of about 425 nm to about 475 nm, thereby fabricating light-emitting devices for evaluation. In addition, a light-emitting device according to the Comparative Example, which has the same structure as the light-emitting devices for evaluation except that the multi-inorganic-film coating layer is omitted, was fabricated.

Table 1 shows a configuration of the multi-inorganic-film coating layer in each of the light-emitting devices for evaluation and the light-emitting device according to the Comparative Example.

TABLE 1

| Number of inorganic film layers | Material of inorganic film | Inorganic film thickness (nm) | | | |
|---|---|---|---|---|---|
| | | Evaluation Example 1 (Three layers) | Evaluation Example 2 (Five layers) | Evaluation Example 3 (Seven layers) | Comparative Example |
| 7 | $SiO_2$ | None | None | 163.3 | None |
| 6 | $TiO_2$ | None | None | 43.0 | None |
| 5 | $SiO_2$ | None | 149.7 | 69.5 | None |
| 4 | $TiO_2$ | None | 41.4 | 44.0 | None |
| 3 | $SiO_2$ | 161.2 | 82.5 | 87.0 | None |
| 2 | $TiO_2$ | 141.0 | 143.4 | 148.1 | None |
| 1 | $SiO_2$ | 80.8 | 87.1 | 90.4 | None |

Figure 6:
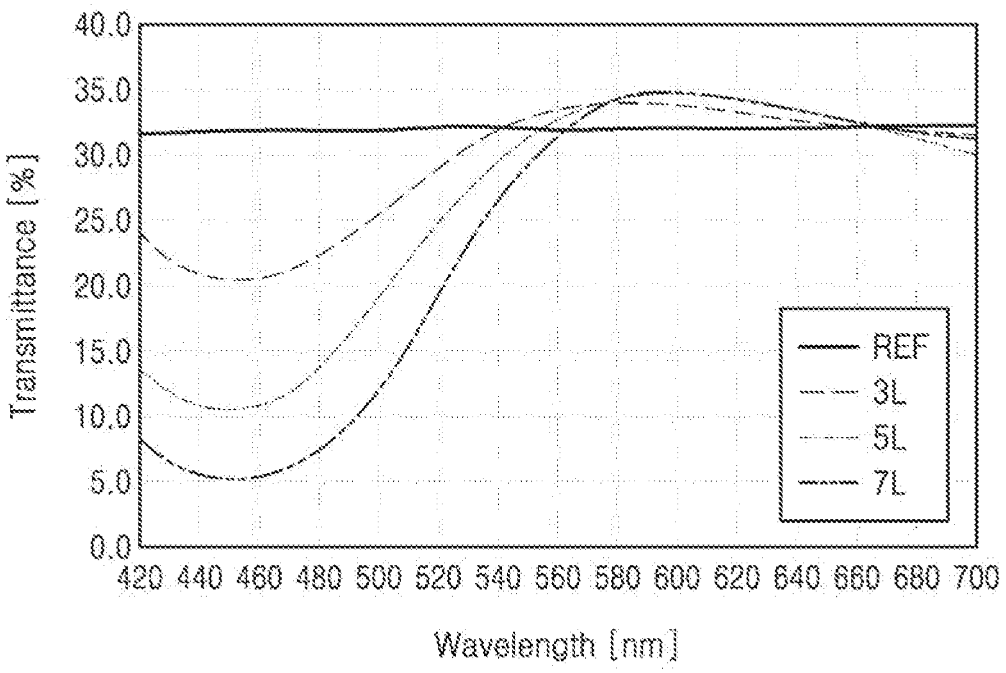
FIG. 6 is a graph illustrating a result of evaluating transmittance along with light wavelengths for light-emitting devices for evaluation and a light-emitting device according to a comparative example.

FIG. 6 is a graph illustrating results of evaluating transmittance along with light wavelengths for each of the light-emitting devices for evaluation and the light-emitting device according to the Comparative Example.

In FIG. 6, among the results of the light-emitting devices for evaluation, the result of Evaluation Example 1 is indicated by “3L”, the result of Evaluation Example 2 is indicated by “5L”, and the result of Evaluation Example 3 is indicated by “7L”. In addition, the result of the Comparative Example is indicated by “REF”.

Table 2 shows the results of comparison between the transmittance of light with a wavelength of 450 nm and the transmittance of light with a wavelength of 600 nm for each of the light-emitting devices for evaluation and the light-emitting device according to the Comparative Example, based on the results of FIG. 6.

TABLE 2

| | Transmittance of 450 nm light (%) | Transmittance of 600 nm light (%) |
|---|---|---|
| Evaluation Example 1 | 20.4 | 33.6 |
| Evaluation Example 2 | 10.5 | 34.4 |
| Evaluation Example 3 | 5.4 | 34.5 |
| Comparative Example | 31.7 | 31.9 |

According to the results of Table 2, by including the multi-inorganic-film coating layer, each of the light-emitting devices according to example embodiments may simultaneously transmit, at a controlled ratio, a portion of light, which is incident from the wavelength conversion layer and has the first wavelength, and light converted from light having the first wavelength by the wavelength conversion layer and thus having a second wavelength that is greater than the first wavelength. Therefore, according to the light-emitting devices according to example embodiments, an intended emission color may be precisely controlled by selectively controlling the transmittance of each of light emitted from the semiconductor light-emitting structure and having the first wavelength and light having the second wavelength.

Table 3 shows the amount of a phosphor in the wavelength conversion layer, a CIE coordinate according to the amount of the phosphor, an evaluation result of luminous flux characteristics, a luminous flux improvement rate, and a saving rate of the phosphor, for each of the light-emitting devices according to Evaluation Example 1 and the light-emitting device according to the Comparative Example. Here, the luminous flux refers to the amount of light passing through a plane with a unit area for a unit time period.

TABLE 3

| | Amount of phosphor | CIE color coordinate | | Luminous flux | Relative luminous flux | Amount of phosphor used |
|---|---|---|---|---|---|---|
| | (wt %) | Cx | Cy | (lumen) | (%) | (%) |
| Evaluation Example 1-1 | 28.5 | 0.5582 | 0.4215 | 306.5 | 104.9 | 77.0 |
| Evaluation Example 1-2 | 29.0 | 0.5598 | 0.4232 | 308.4 | 105.5 | 78.4 |
| Evaluation Example 1-3 | 30.0 | 0.5604 | 0.4239 | 295.5 | 101.1 | 81.1 |
| Comparative Example | 37.0 | 0.5650 | 0.4239 | 292.3 | 100 | 100 |

In Table 3, the relative luminous flux refers to a relative luminous flux in each Evaluation Example when the luminous flux in the Comparative Example is taken as 100%, and the amount of the phosphor used refers to a relative amount of the phosphor used in each Evaluation Example when the amount of the phosphor used in the Comparative Example is taken as 100%.

According to the results of Table 3, in obtaining light having an equal or similar color coordinate, each of the light-emitting devices according to example embodiments exhibited an improved luminous flux as compared with the Comparative Example even when the amount of the phosphor used was reduced by as much as about 20% to about 30% as compared with the Comparative Example. In particular, from the results of Evaluation Examples 1-1 and 1-2, it can be seen that each of the light-emitting devices according to example embodiments exhibit a luminous flux improved by as much as about 4% to about 6% as compared with the Comparative Example. Therefore, the light-emitting devices according to example embodiments may reduce the fabrication cost thereof by reducing the amount of a material for conversion of a light wavelength and may have an improved luminous efficiency by improving the luminous flux thereof. In addition, from the results of Table 3, it can be seen that the light-emitting devices according to example embodiments may be used to precisely control an intended emission color.

Figure 7:
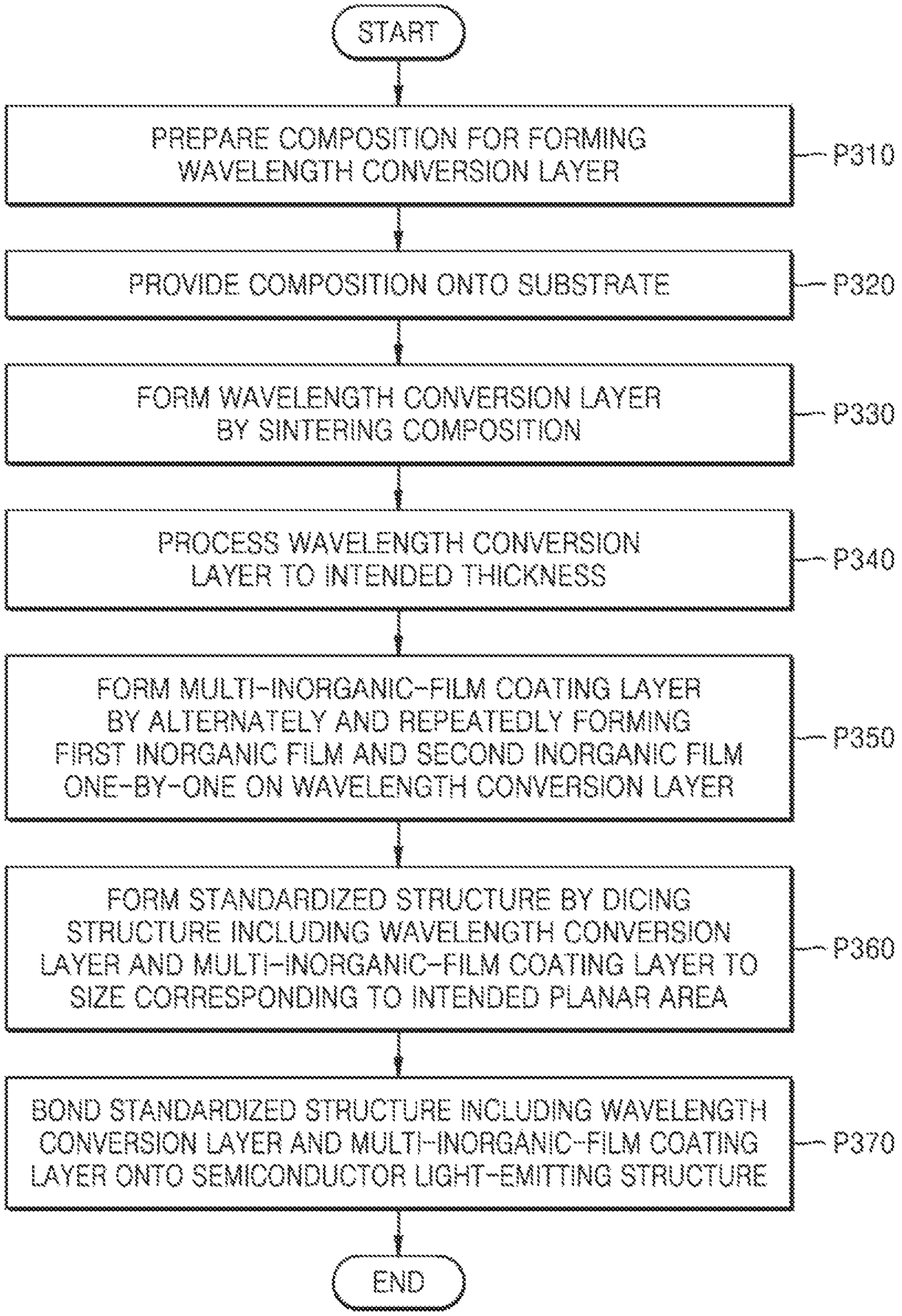
FIG. 7 is a flowchart illustrating a method of fabricating a light-emitting device, according to some example embodiments.

FIG. 7 is a flowchart illustrating a method of fabricating a light-emitting device, according to some example embodiments.

Referring to FIGS. 1A, 1B, and 7, in process P310, a composition for forming the wavelength conversion layer 120 may be prepared.

The composition for forming the wavelength conversion layer 120 may include glass powder and phosphor powder. The kind and amount of each of the glass powder and the phosphor powder are the same as described with reference to FIGS. 1A and 1B. In some example embodiments, the composition for forming the wavelength conversion layer 120 may further include a binder resin, a solvent, a plasticizer, or a combination thereof. The binder resin may include polyvinyl butyral (PVB), polyvinyl alcohol (PVA), polyvinyl acetate (PVAc), or combination thereof. The binder resin may have a weight-average molecular weight of about 1,000 g/mol to about 70,000 g/mol, for example, about 20,000 g/mol to about 60,000 g/mol. The solvent may include toluene, ethanol, butanol, acetone, methanol, or a combination thereof. The plasticizer may include dioctyl phthalate (DOP), dioctyl adipate (DOA), tricresyl phosphate (TCP), or a combination thereof. The plasticizer may be present in an amount of about 10 parts by weight to about 200 parts by weight, for example, about 30 parts by weight to about 90 parts by weight, based on 100 parts by weight of the binder resin. A binder solution may be obtained by mixing the solvent with the binder resin and degassing the mixture, followed by mixing the binder solution, the glass powder, the phosphor powder, the plasticizer, and the like, thereby preparing the composition for forming the wavelength conversion layer 120.

In process P320 of FIG. 7, the composition for forming the wavelength conversion layer 120 may be provided onto a substrate. The providing of the composition for forming the wavelength conversion layer 120 onto the substrate may be performed by a tape casting method or by using a doctor blade. The substrate may include a polyester-based resin, for example, a polyethylene terephthalate (PET) resin.

In process P330 of FIG. 7, the wavelength conversion layer 120 may be formed by sintering the composition provided onto the substrate according to process P320. The sintering of the composition may be performed at about 450° C. to about 950° C. for about 10 minutes to about 72 hours.

In process P340 of FIG. 7, the wavelength conversion layer 120 obtained according to process P330 may be processed to an intended thickness. To this end, a grinding or polishing process may be performed. In some example embodiments, the wavelength conversion layer 120 may be processed to a thickness of about 30 μm to about 300 μm, for example, about 95 μm to about 200 μm.

In process P350 of FIG. 7, the first inorganic film 132 and the second inorganic film 134 may be alternately and repeatedly formed one-by-one on the wavelength conversion layer 120 obtained according to process P340, thereby forming the multi-inorganic-film coating layer 130, which includes a plurality of inorganic films 132 and 134.

In some example embodiments, the multi-inorganic-film coating layer 130 may be formed to a thickness of about 200 nm to about 1000 nm, for example, about 300 nm to about 700 nm or about 300 nm to about 500 nm.

In some example embodiments, to form the multi-inorganic-film coating layer 130, a coating process, a molecular beam epitaxy (MBE) process, or a metal organic chemical vapor deposition (MOCVD) process may be used, but example embodiments are not limited thereto.

In some example embodiments, instead of the multi-inorganic-film coating layer 130, one of the multi-inorganic-film coating layers 130A, 130B, and 130C shown in FIGS. 2 to 4 may be formed.

In process P360 of FIG. 7, a structure including the wavelength conversion layer 120 and the multi-inorganic-film coating layer 130 may be diced to a size corresponding to an intended planar area, thereby forming a standardized structure. In some example embodiments, the standardized structure may have a square planar shape in which the length of one side thereof is about 1000 μm to about 1500 μm.

In process P370 of FIG. 7, the standardized structure, which is obtained according to process P360 and includes the wavelength conversion layer 120 and the multi-inorganic-film coating layer 130, may be bonded onto the semiconductor light-emitting structure 110.

Figure 8A:
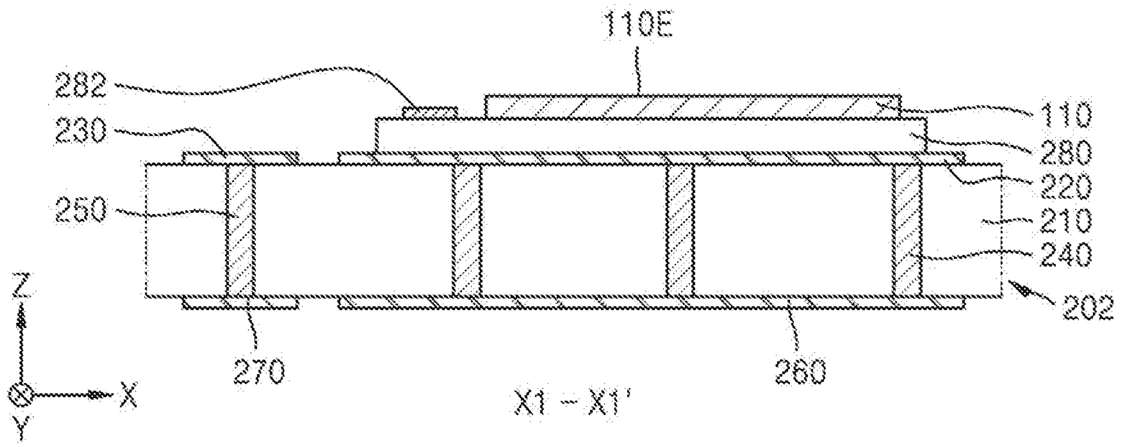
FIGS. 8A, 8B and 8C are cross-sectional views respectively illustrating a sequence of processes of the method of fabricating a light-emitting device, shown in FIG. 7, by taking more specific examples.
Figure 8B:
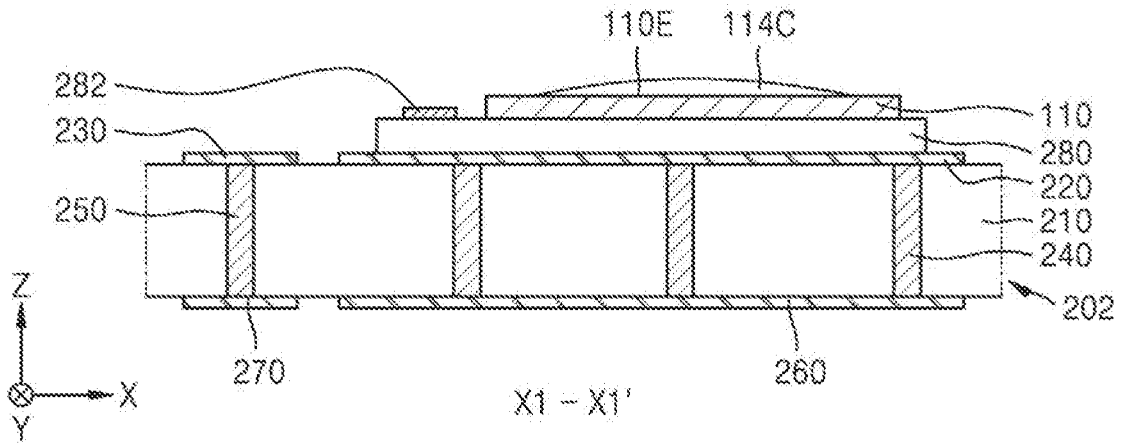
Figure 8C:
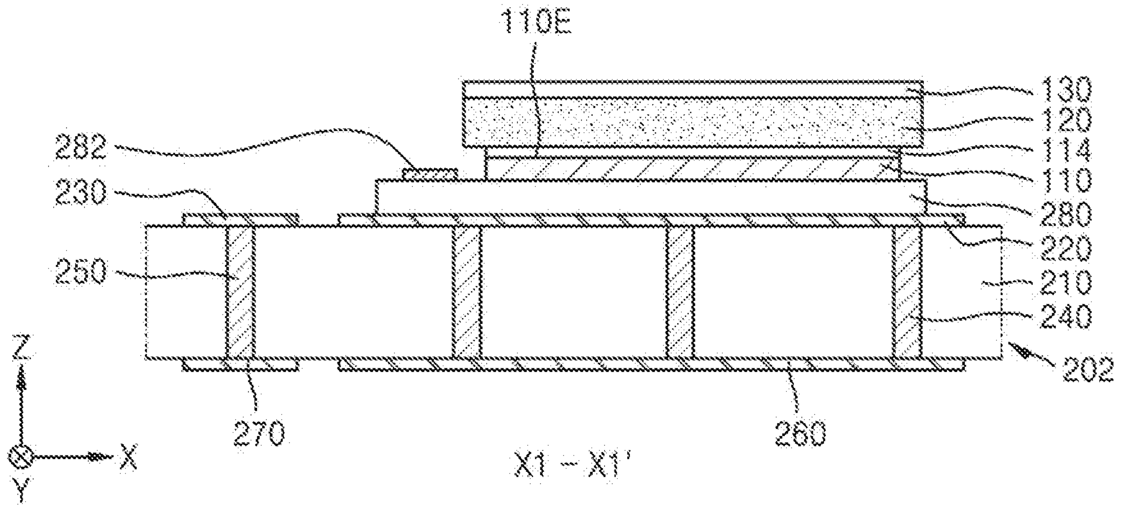

FIGS. 8A to 8C are cross-sectional views respectively illustrating a sequence of processes of a specific example of the process of bonding the standardized structure onto the semiconductor light-emitting structure 110 according to process P370 of FIG. 7. FIGS. 8A to 8C each illustrate a cross-sectional configuration of some components in a region corresponding to the cross-section taken along the line X1-X1' of FIG. 5A, according to the sequence of processes.

Referring to FIG. 8A, a structure including the substrate structure 280 and the semiconductor light-emitting structure 110 may be mounted on the first upper wiring layer 220 of the package substrate 202. To this end, a process of bonding the substrate structure 280 onto the package substrate 202 may be performed. In the bonding process, eutectic bonding may be used. In some example embodiments, the substrate structure 280 may be mounted on the package substrate 202 via a solder ball or a bonding layer.

Next, the first bonding wire BW1 (see FIG. 5A) for electrically connecting the package substrate 202 with the substrate structure 280 may be formed. In addition, as shown in FIG. 5A, the Zener diode ZD may be mounted on the first upper wiring layer 220, and the second bonding wire BW2 for electrically connecting the second upper wiring layer 230 with the Zener diode ZD may be formed.

Referring to FIG. 8B, a bonding material 114C may be applied onto the semiconductor light-emitting structure 110. To this end, the bonding material 114C may be applied onto the light-emitting surface 110E of the semiconductor light-emitting structure 110 via a nozzle. A detailed composition of the bonding material 114C is the same as the composition of the bonding layer 114, which is described with reference to FIGS. 1A and 1B.

Referring to FIG. 8C, the standardized structure, which is obtained according to process P360 of FIG. 7 and includes the wavelength conversion layer 120 and the multi-inorganic-film coating layer 130, may be placed on the light-emitting surface 110E of the semiconductor light-emitting structure 110 with the bonding material 114C therebetween and then be pressed, thereby bonding the standardized structure onto the light-emitting surface 110E of the semiconductor light-emitting structure 110. Due to the pressure applied during the bonding of the standardized structure onto the light-emitting surface 110E of the semiconductor light-emitting structure 110, the bonding material 114C may be slimly spread in a space between the light-emitting surface 110E of the semiconductor light-emitting structure 110 and the wavelength conversion layer 120. Next, the bonding layer 114 may be formed from the bonding material 114C by curing the obtained resulting product. In some example embodiments, the curing process may be performed at about 150° C. to about 200° C., for example, about 160° C. to about 180° C., for about 30 minutes to about 10 hours, for example, about 1 hour to about 2 hours.

Next, as shown in FIGS. 5A and 5B, the reflective resin layer 290 may be formed to encapsulate the sidewall of the stack structure including the semiconductor light-emitting structure 110, the bonding layer 114, the wavelength conversion layer 120, and the multi-inorganic-film coating layer 130.

Figure 9:
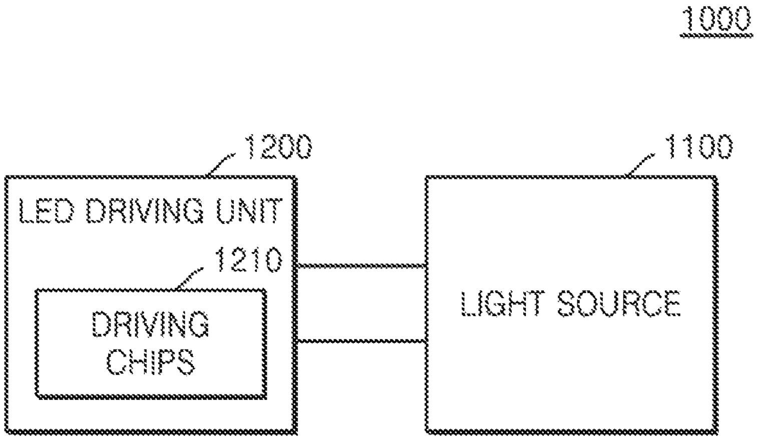
FIG. 9 is a block diagram illustrating a configuration of a light source module according to some example embodiments.

FIG. 9 is a block diagram illustrating a configuration of a light source module 1000 according to some example embodiments.

Referring to FIG. 9, the light source module 1000 may include a light source 1100 and an LED driving unit (e.g., driver or driving circuit) 1200. The light source 1100 may include at least one of the light-emitting devices 100, 100A, 100B, 100C, and 200 described with reference to FIGS. 1A to 5B.

The LED driving unit 1200 may be connected to a power supply, and the power supply may generate an input voltage, which is necessary for the light source 1100 to operate, and may provide the input voltage to the light source 1100. In some example embodiments, when the light source module 1000 corresponds to an automotive head lamp, the power supply may correspond to a battery mounted in an automobile. In some example embodiments, when the light source module 1000 corresponds to a home or industrial illumination device, the light source module 1000 may further include an alternating current (AC) power supply for generating an AC voltage, a rectifier circuit for generating a direct current (DC) voltage by rectifying an AC voltage, a voltage regulator circuit, and the like.

The LED driving unit 1200 may include a plurality of driving chips 1210. Each of the plurality of driving chips 1210 may be implemented by an integrated circuit chip. The plurality of driving chips 1210 may drive the light source 1100.

Figure 10:
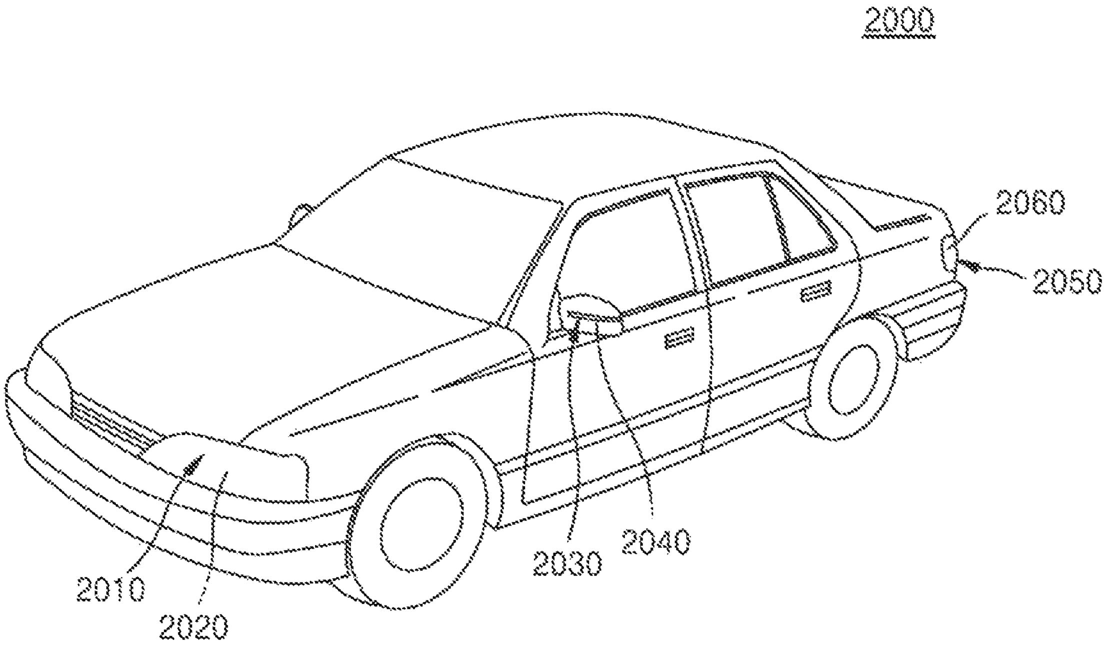
FIG. 10 is a perspective view schematically illustrating an illumination device including a light source module according to some example embodiments.

FIG. 10 is a perspective view schematically illustrating an illumination device including a light source module according to some example embodiments.

Referring to FIG. 10, a head lamp module 2020 may be mounted in a head lamp unit 2010 of an automobile, a side mirror lamp module 2040 may be mounted in an external side mirror unit 2030, and a tail lamp module 2060 may be mounted in a tail lamp unit 2050. At least one of the head lamp module 2020, the side mirror lamp module 2040, and the tail lamp module 2060 may include at least one of the light-emitting devices 100, 100A, 100B, 100C, and 200 described with reference to FIGS. 1A to 5B.

Figure 11:
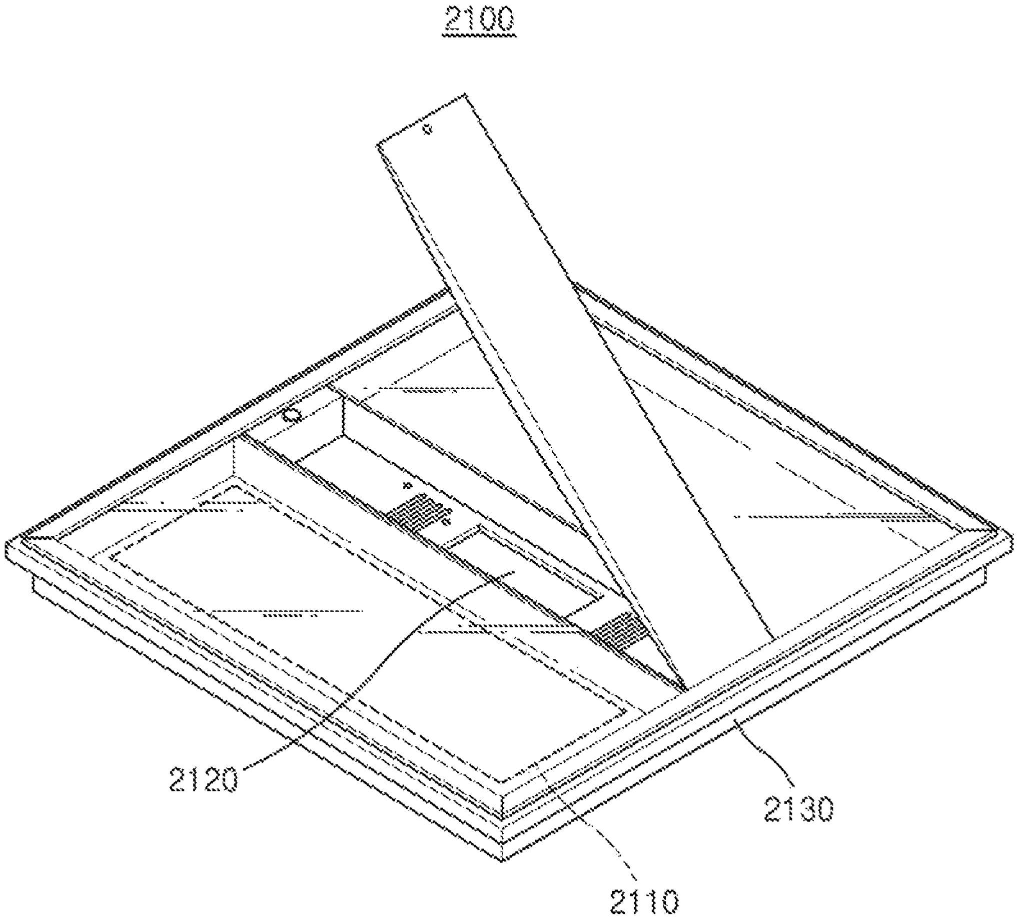
FIG. 11 is a perspective view schematically illustrating a flat-panel illumination device including a light source module according to some example embodiments.

FIG. 11 is a perspective view schematically illustrating a flat-panel illumination device including a light source module according to some example embodiments.

Referring to FIG. 11, the flat-panel illumination device 2100 may include a light source module 2110, a power supply 2120, and a housing 2130.

The light source module 2110 may include at least one of the light-emitting devices 100, 100A, 100B, 100C, and 200 described with reference to FIGS. 1A to 5B. The light source module 2110 may have a planar shape on the whole.

The power supply 2120 may be configured to supply power to the light source module 2110. The housing 2130 may include an accommodation space to accommodate the light source module 2110 and the power supply 2120 therein and may have, but is not limited to, a hexahedral shape with one side surface open. The light source module 2110 may be arranged to emit light toward the open one side surface of the housing 2130.

Figure 12:
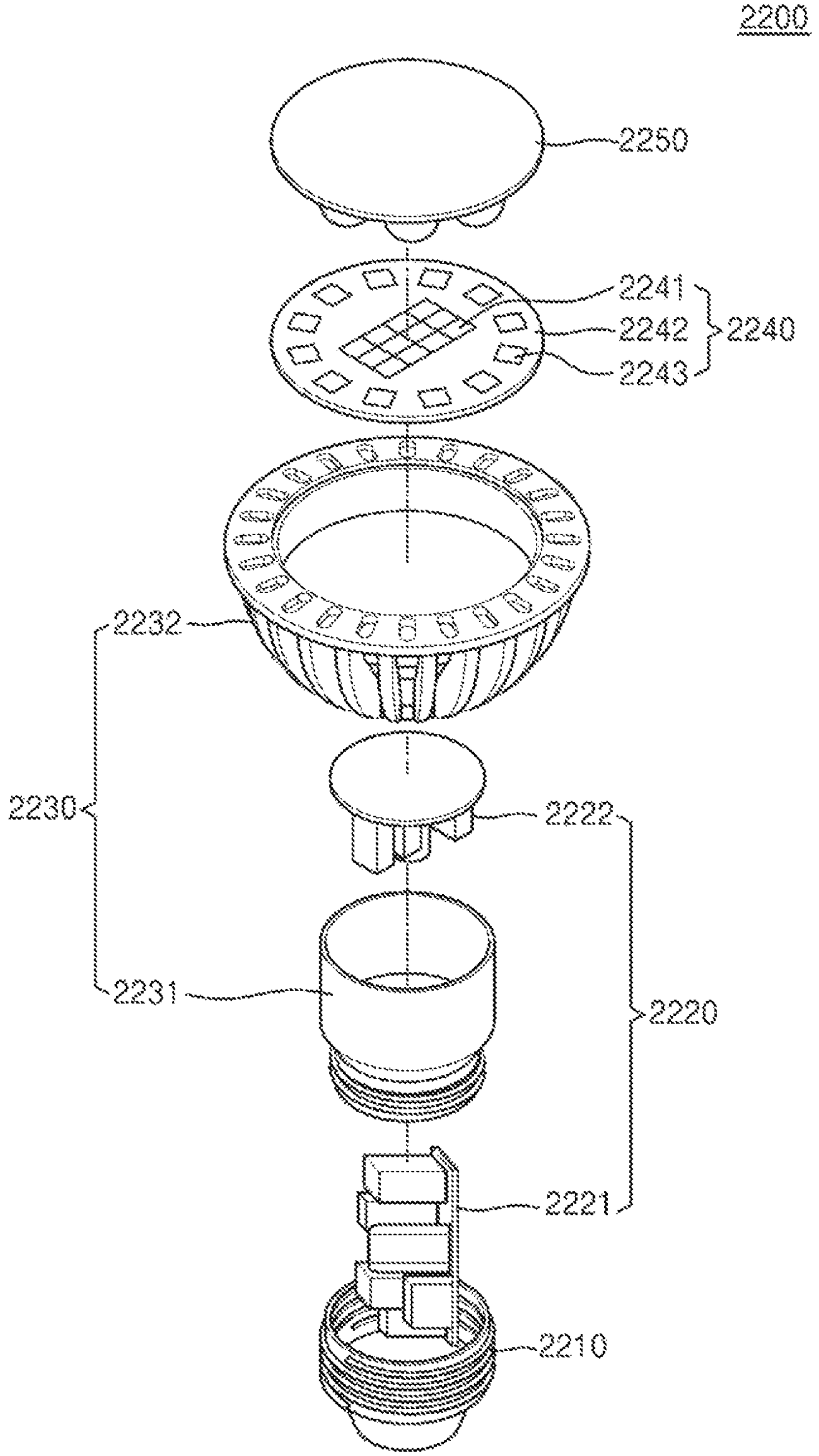
FIG. 12 is an exploded perspective view schematically illustrating an illumination device including a light source module according to some example embodiments.

FIG. 12 is an exploded perspective view schematically illustrating an illumination device including a light source module according to some example embodiments.

An illumination device 2200 may include a socket 2210, a power supply unit 2220, a heat dissipation unit 2230, a light source module 2240, and an optical unit 2250.

The socket 2210 may be configured to be replaceable with that of an existing illumination device. Power supplied to the illumination device 2200 may be applied through the socket 2210. The power supply unit 2220 may be assembled while separated into a first power supply unit 2221 and a second power supply unit 2222. The heat dissipation unit 2230 may include an inner heat dissipation unit 2231 and an outer heat dissipation unit 2232. The inner heat dissipation unit 2231 may be directly connected with the light source module 2240 and/or the power supply unit 2220 and thus allow heat to be transferred to the outer heat dissipation unit 2232. The optical unit 2250 may include an inner optical unit and an outer optical unit and may be configured to uniformly disperse light emitted by the light source module 2240.

The light source module 2240 may receive power from the power supply unit 2220 and emit light toward the optical unit 2250. The light source module 2240 may include at least one light-emitting device package 2241, a circuit board 2242, and a controller 2243. The controller 2243 may store driving information of the light-emitting device package 2241. The light source module 2240 may include at least one of the light-emitting devices 100, 100A, 100B, 100C, and 200 described with reference to FIGS. 1A to 5B.

Figure 13:
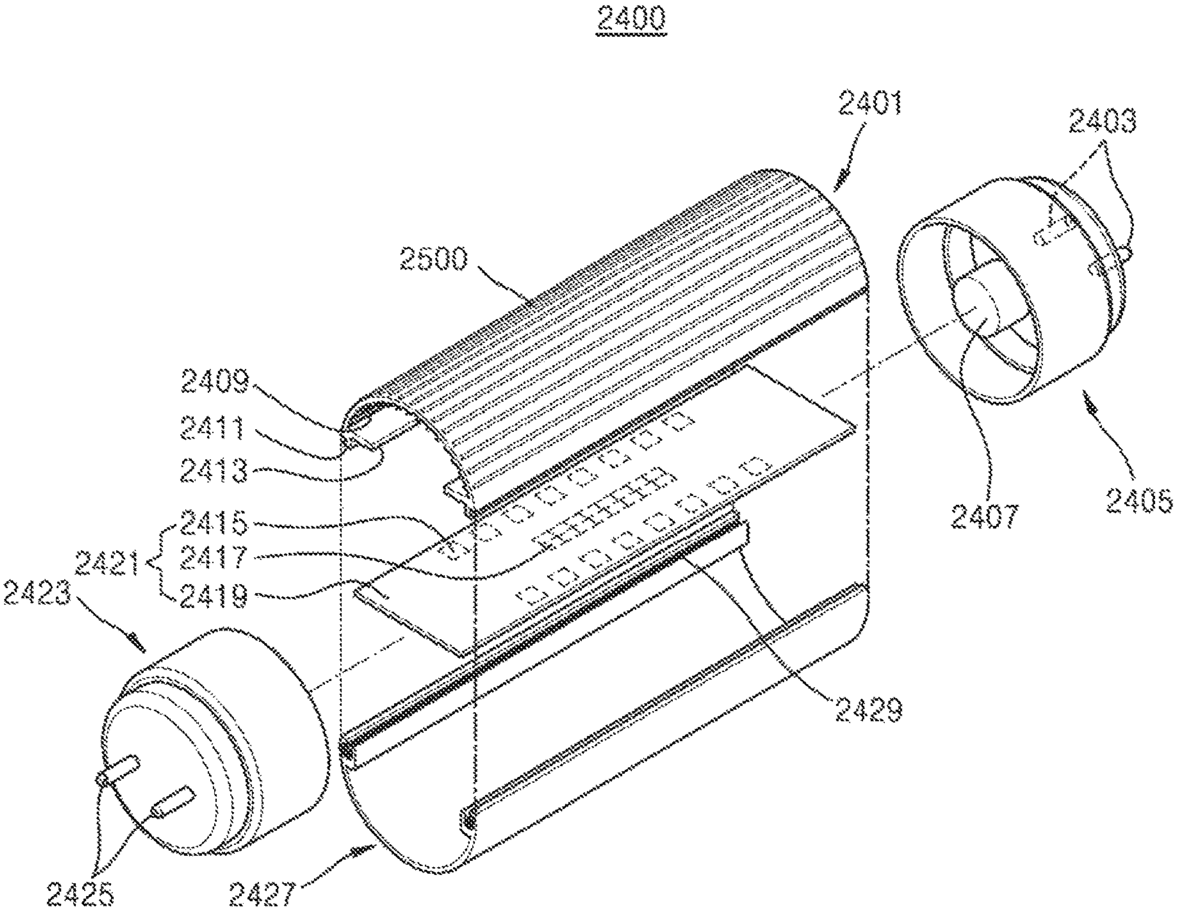
FIG. 13 is an exploded perspective view schematically illustrating a bar-type illumination device including a light source module according to some example embodiments.

FIG. 13 is an exploded perspective view schematically illustrating a bar-type illumination device including a light source module according to some example embodiments.

Referring to FIG. 13, an illumination device 2400 includes a heat dissipation member 2401, a cover 2427, a light source module 2421, a first socket 2405, and a second socket 2423. A plurality of dissipation pins 2450 and 2409 may be formed in an uneven shape on inner and/or outer surfaces of the heat dissipation member 2401, and the dissipation pins 2450 and 2409 may be designed to have various shapes and intervals. A support 2413 of a protrusion shape is formed inside the heat dissipation member 2401. The light source module 2421 may be secured to the support 2413. A catching bump 2411 may be formed at both ends of the heat dissipation member 2401.

A catching groove 2429 may be formed in the cover 2427, and the catching bump 2411 of the heat dissipation member 2401 may be coupled to the catching groove 2429 in a hook coupling manner. The positions, at which the catching groove 2429 and the catching bump 2411 are respectively formed, may be interchanged with each other.

The light source module 2421 may include a printed circuit board 2419, a light source 2417, and a controller 2415. The controller 2415 may store driving information of the light source 2417. Circuit wiring lines for operating the light source 2417 are formed in the printed circuit board 2419. In addition, components for operating the light source 2417 may also be included in the printed circuit board 2419. The light source module 2421 may include at least one of the light-emitting devices 100, 100A, 100B, 100C, and 200 described with reference to FIGS. 1A to 5B.

A pair of sockets, which include the first socket 2405 and the second socket 2423, have a structure of being respectively coupled to both ends of a cylindrical cover unit including the heat dissipation member 2401 and the cover 2427. For example, the first socket 2405 may include an electrode terminal 2403 and a power supply 2407, and a dummy terminal 2425 may be arranged on the second socket 2423. In addition, an optical sensor and/or a communication module may be embedded in one of the first socket 2405 and the second socket 2423.

Figure 14:
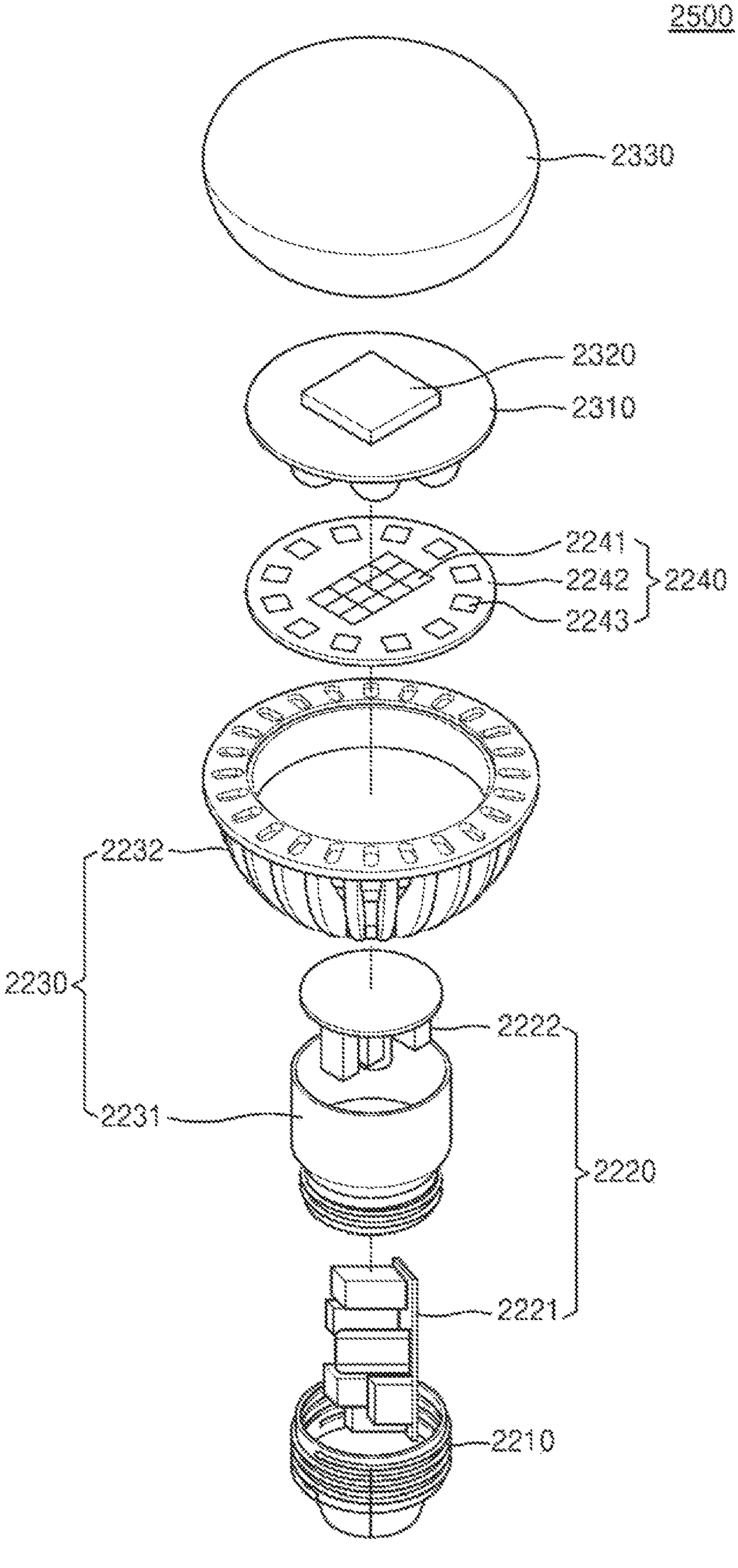
FIG. 14 is an exploded perspective view schematically illustrating an illumination device including a light source module according to some example embodiments.

FIG. 14 is an exploded perspective view schematically illustrating an illumination device including a light source module according to some example embodiments.

An illumination device 2500 shown in FIG. 14 has a substantially similar configuration to that of the illumination device 2200 shown in FIG. 12. However, the illumination device 2500 includes a reflective plate 2310 and a communication module 2320, which are arranged over the light source module 2240. The reflective plate 2310 may reduce glare by uniformly spreading light from a light source toward the lateral and rear sides thereof. The communication module 2320 may be mounted on the reflective plate 2310. Home-network communication may be implemented through the communication module 2320. For example, the communication module 2320 may include a wireless communication module using ZigBee, Wi-Fi, or Li-Fi and, through a smartphone or a wireless controller, may control lights mounted inside and outside the home, such as turning-on/turning-off or brightness adjustment of illumination devices, or may control electronic products and automotive systems inside and outside the home, such as a television (TV), a refrigerator, an air conditioner, a door lock, and an automobile. The reflective plate 2310 and the communication module 2320 may be covered by a cover unit 2330.

Figure 15:
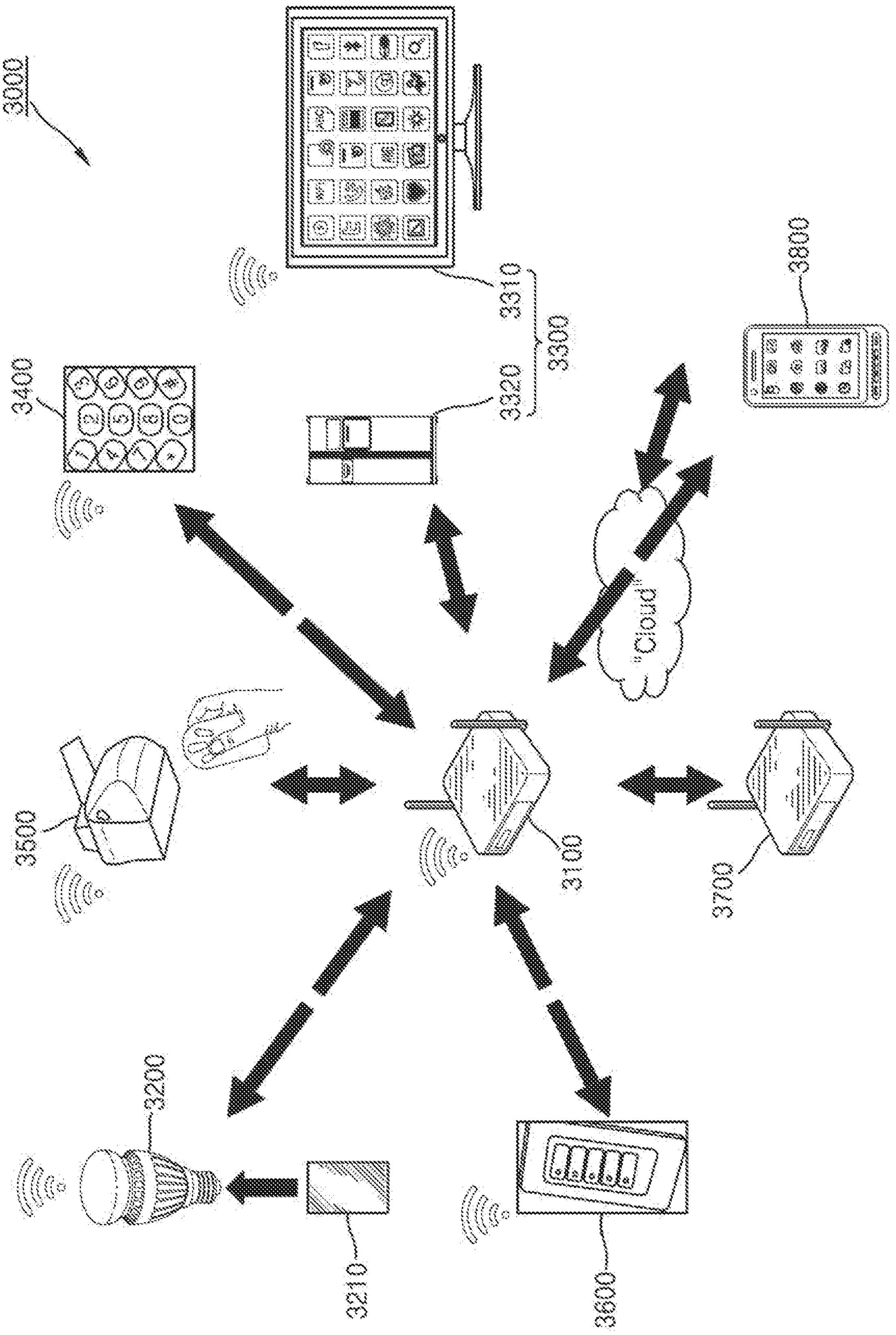
FIG. 15 is a schematic diagram illustrating an indoor illumination control network system including a light source module according to some example embodiments.

FIG. 15 is a schematic diagram illustrating an indoor illumination control network system including a light source module according to some example embodiments.

Referring to FIG. 15, a network system 3000 may include a complex smart illumination-network system, in which illumination techniques using light emitting devices, such as LEDs or the like, internet-of-things (IoT) techniques, wireless communication techniques, and the like are fused. The network system 3000 may be implemented by using various illumination devices and wired and wireless communication devices or may be implemented based on an IoT environment such that various pieces of information may be collected/processed and thus provided to users.

An LED lamp 3200 in the network system 3000 may control the illumination of the LED lamp 3200 itself in response to receiving information about a surrounding environment from a gateway 3100 and may perform operation state checking, control, and the like on a plurality of other devices (e.g., 3300, 3400, 3500, 3600, 3700, and 3800) in the IoT environment, based on functions, such as visible light communication, of the LED lamp 3200.

The LED lamp 3200 may include at least one of the light-emitting devices 100, 100A, 100B, 100C, and 200 described with reference to FIGS. 1A to 5B. The LED lamp 3200 may be communicably connected with the gateway 3100 by a wireless communication protocol, such as Wi-Fi, ZigBee, or Li-Fi, and, to this end, may have at least one communication module 3210 for lamps.

When the network system 3000 is applied to a home, the plurality of devices (e.g., 3300, 3400, 3500, 3600, 3700, and 3800) may include home appliances 3300, a digital door lock 3400, a garage door lock 3500, an illumination switch 3600 mounted on a wall or the like, a router 3700 for wireless communication network relay, and a mobile device 5800, such as a smartphone, a tablet PC, or a laptop computer.

In the network system 3000, by using a wireless communication network (ZigBee, Wi-Fi, Li-Fi, or the like) mounted in the home, the LED lamp 3200 may check operation states of the plurality of devices (e.g., 3300, 3400, 3500, 3600, 3700, and 3800) of various types or may automatically adjust the illuminance of the LED lamp 3200 itself depending on surrounding environments/circumstances. In addition, by using Li-Fi communication using visible light emitted from the LED lamp 3200, the plurality of devices (e.g., 3300, 3400, 3500, 3600, 3700, and 3800) in the network system 3000 may be controlled.

The LED lamp 3200 may automatically adjust the illuminance of the LED lamp 3200, based on surrounding environment information, which is transferred from the gateway 3100 through the communication module 3210 for lamps, or which is collected by a sensor mounted in the LED lamp 3200. For example, according to the kind of program broadcasted on a TV 3310 or the brightness of a screen of the TV 3310, the illumination brightness of the LED lamp 3200 may be automatically adjusted. To this end, the LED lamp 3200 may receive operation information of the TV 3310 from the communication module 3210 for lamps, which is connected with the gateway 3100. The communication module 3210 for lamps may be modularized integrally with a sensor and/or a controller included in the LED lamp 3200.

For example, while no one is in the home, when a certain time period elapses after the digital door lock 3400 is locked, waste of electricity may be prevented by turning off all of turned-on LED lamps 3200. Alternatively, in the case where a security mode is set through the mobile device 3800 or the like, when the digital door lock 3400 is locked while no one is in the home, the LED lamp 3200 may be maintained turned-on.

Operations of the LED lamp 3200 may be controlled according to surrounding environment information collected by various sensors connected with the network system 3000. For example, when the network system 3000 is implemented in a building, lights, position sensors, and communication modules in the building may be combined with each other, whereby the lights may be turned on or off by collecting information about positions of persons in the building, or the management of facilities or the efficient utilization of idle spaces may be allowed by providing the collected information in real time.

Figure 16:
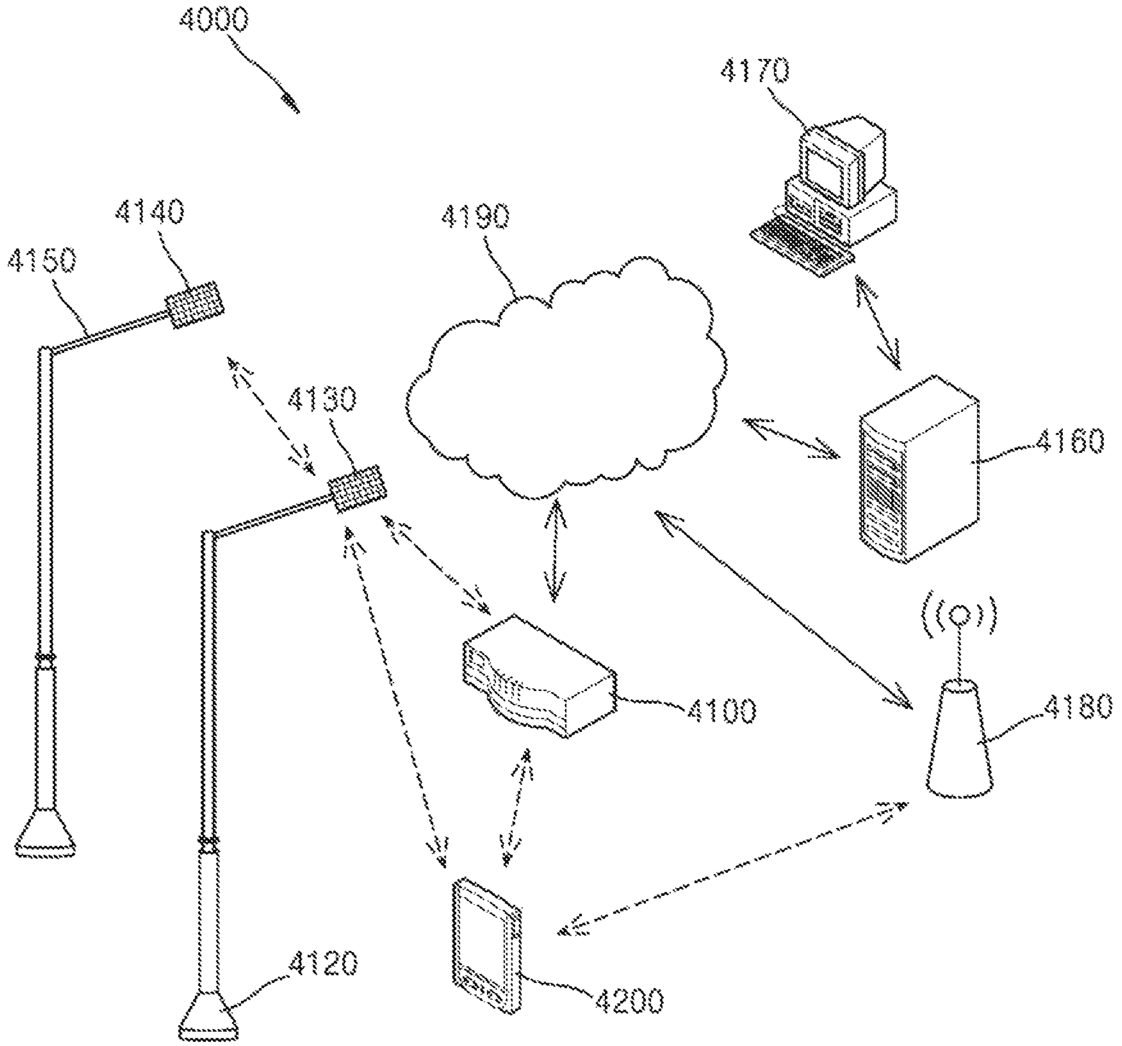
FIG. 16 is a schematic diagram illustrating a network system including a light source module according to some example embodiments.

FIG. 16 is a schematic diagram illustrating a network system including a light source module according to some example embodiments. FIG. 16 illustrates a schematic configuration of a network system 4000 applied to an open space.

Referring to FIG. 16, the network system 4000 may include a communication connecting device 4100, a plurality of illumination devices 4120 and 4150, which are mounted at certain intervals and communicably connected with the communication connecting device 4100, a server 4160, a computer 4170 for managing the server 4160, a communication base station 4180, a communication network 4190 connecting communicable devices to each other, a mobile device 4200, and the like.

The plurality of illumination devices 4120 and 4150 mounted in an open outdoor space, such as a street or a park, may include smart engines 4130 and 4140, respectively. Each of the smart engines 4130 and 4140 may include a sensor for collecting information of a surrounding environment, a communication module, and the like, in addition to a light-emitting device for emitting light and a driver for driving the light-emitting device. Each of the smart engines 4130 and 4140 may include at least one of the light-emitting devices 100, 100A, 100B, 100C, and 200 described with reference to FIGS. 1A to 5B.

Each of the smart engines 4130 and 4140 may communicate with other devices therearound according to a communication protocol, such as Wi-Fi, ZigBee, or Li-Fi, by the communication module. One smart engine (for example, 4130) may be communicably connected with another smart engine (for example, 4140), and a Wi-Fi extension (Wi-Fi mesh) technique may be applied to communications between the smart engines 4130 and 4140. At least one smart engine (for example, 4130) may be connected with the communication connecting device 4100, which is connected to the communication network 4190, by wired/wireless communications.

The communication connecting device 4100, which is an access point (AP) allowing wired/wireless communications, may relay communications between the communication network 4190 and another device. The communication connecting device 4100 may be connected with the communication network 4190 by at least one of wired and wireless methods, and as an example, the communication connecting device 4100 may be mechanically accommodated in one of the illumination devices 4120 and 4150.

The communication connecting device 4100 may be connected with the mobile device 4200 through a communication protocol, such as Wi-Fi. A user of the mobile device 4200 may receive surrounding environment information, for example, surrounding traffic information, weather information, or the like, which is collected by the plurality of smart engines 4130 and 4140, through the communication connecting device 4100 connected with the smart engine 4130 of the illumination device 4120 adjacent to the mobile device 4200. The mobile device 4200 may be connected to the communication network 4190 in a wireless cellular communication manner, such as 3G or 4G, through the communication base station 4180.

The server 4160, which is connected to the communication network 4190, may monitor an operation state or the like of each of the illumination devices 4120 and 4150 while receiving information collected by the smart engines 4130 and 4140 respectively mounted in the illumination devices 4120 and 4150. The server 4160 may be connected with the computer 4170, which provides a management system, and the computer 4170 may execute software or the like, which may monitor and manage the operation state of each of the smart engines 4130 and 4140.

While aspects of example embodiments have been particularly shown and described, it will be understood that various changes in form and details may be made therein without departing from the spirit and scope of the following claims.

What is claimed is:

1. A light-emitting device comprising:

a semiconductor light-emitting structure configured to emit light having a first wavelength through a light-emitting surface;

a wavelength conversion layer facing the light-emitting surface and configured to convert at least a portion of the light which has the first wavelength into light having a second wavelength that is greater than the first wavelength; and a multi-inorganic-film coating layer spaced apart from the light-emitting surface with the wavelength conversion layer therebetween, the multi-inorganic-film coating layer being configured to simultaneously transmit both a portion of the light having the first wavelength and a portion of the light having the second wavelength, which are incident from the wavelength conversion layer, wherein the multi-inorganic-film coating layer comprises a distributed Bragg reflector (DBR) structure comprising a plurality of inorganic films, in which a first inorganic film having a first refractive index and a second inorganic film having a second refractive index are alternately stacked, and an uppermost inorganic film farthest from the wavelength conversion layer from among the plurality of inorganic films has a greatest thickness in a first direction perpendicular to the light-emitting surface of the semiconductor light-emitting structure, and wherein the first refractive index is selected from a range of about 1.1 to about 1.5 and the second refractive index is selected from a range of about 2.0 to about 3.0.

2. The light-emitting device of claim 1, wherein the first inorganic film comprises $SiO_2$, $MgF_2$, $BaF_2$, $CaF_2$, CsF, or a combination thereof, and wherein the second inorganic film comprises $TiO_2$, $ZrO_2$, ZnO, $WO_3$, or a combination thereof.

3. The light-emitting device of claim 1, wherein the multi-inorganic-film coating layer is configured to reflect about 30% to about 95% of the light having the first wavelength, transmit about 5% to about 60% of the light having the first wavelength, and transmit only a portion of the light having the second wavelength.

4. The light-emitting device of claim 1, wherein a total sum of the plurality of inorganic films is 3 to 7, and wherein among the plurality of inorganic films, an inorganic film closest to the wavelength conversion layer and an inorganic film farthest from the wavelength conversion layer each comprise the first inorganic film.

5. The light-emitting device of claim 1, wherein a thickness of the multi-inorganic-film coating layer in the first direction is about 200 nm to about 1000 nm.

6. The light-emitting device of claim 1, wherein the plurality of inorganic films of the multi-inorganic-film coating layer comprise a plurality of first inorganic films and at least one second inorganic film, and wherein in the first direction, respective thicknesses of the plurality of first inorganic films and the at least one second inorganic film are different from each other.

7. The light-emitting device of claim 1, wherein the plurality of inorganic films of the multi-inorganic-film coating layer comprise a plurality of first inorganic films and a plurality of second inorganic films, wherein among the plurality of first inorganic films, a first inorganic film farthest from the wavelength conversion layer has a greatest thickness in the first direction, and wherein among the plurality of second inorganic films, a second inorganic film closest to the wavelength conversion layer has a greatest thickness in the first direction.

8. The light-emitting device of claim 1, wherein the wavelength conversion layer comprises a plurality of phosphors configured to be excited by the light having the first wavelength, and emit the light having the second wavelength selected from a range of about 500 nm to about 800 nm, and wherein the plurality of phosphors are present in an amount of about 10% by weight (wt %) to about 40 wt % in the wavelength conversion layer, based on a total weight of the wavelength conversion layer.

9. The light-emitting device of claim 1, wherein the wavelength conversion layer comprises a glass-phosphor composite, which comprises a glass matrix and a plurality of phosphors dispersed in the glass matrix, and wherein the plurality of phosphors comprise α-SiAlON represented by:

$$Ca_xEu_ySi_{12-m-n}Al_{m+n}O_nN_{16-n}$$

$$0.25 \leq x \leq 2.00,$$

$$0.001 \leq y \leq 0.100,$$

$$0.001 \leq n \leq 11.490,$$

$$\text{and } 0.51 \leq m+n \leq 11.99.$$

10. The light-emitting device of claim 1, wherein the wavelength conversion layer has a thickness of about 30 μm to about 200 μm in the first direction.

11. The light-emitting device of claim 1, further comprising:

a bonding layer between the semiconductor light-emitting structure and the wavelength conversion layer; and a reflective resin layer on a sidewall of each of the semiconductor light-emitting structure, the bonding layer, the wavelength conversion layer, and the multi-inorganic-film coating layer, wherein each of the wavelength conversion layer and the multi-inorganic-film coating layer protrudes outward from the semiconductor light-emitting structure around the light-emitting surface of the semiconductor light-emitting structure, wherein the wavelength conversion layer has an upper surface and a lower surface that is opposite to the upper surface, the upper surface being in contact with the multi-inorganic-film coating layer, and wherein the reflective resin layer comprises a portion contacting the lower surface of the wavelength conversion layer.

12. The light-emitting device of claim 11, wherein the multi-inorganic-film coating layer and the reflective resin layer are exposed to outside of the light-emitting device, and wherein an upper surface of the multi-inorganic-film coating layer and an upper surface of the reflective resin layer are coplanar with each other.

13. The light-emitting device of claim 1, wherein light emitted from the multi-inorganic-film coating layer corresponds to one color coordinate, which has a Cx value selected from a range of about 0.53 to about 0.60 and a Cy value selected from a range of about 0.40 to about 0.47 based on Commission Internationale de l'Eclairage (CIE) color coordinates.

14. A light-emitting device comprising:

a semiconductor light-emitting structure configured to emit light having a first wavelength selected from a range of about 400 nm to about 500 nm through a light-emitting surface;

a wavelength conversion layer facing the light-emitting surface and comprising a plurality of phosphors, the plurality of phosphors being configured to be excited by the light having the first wavelength and emit light having a second wavelength, which is greater than the first wavelength and selected from a range of about 500 nm to about 800 nm; and a multi-inorganic-film coating layer spaced apart from the light-emitting surface with the wavelength conversion layer therebetween, the multi-inorganic-film coating layer being configured to simultaneously transmit both a portion of the light having the first wavelength and a portion of the light having the second wavelength, which are incident from the wavelength conversion layer, wherein the multi-inorganic-film coating layer comprises a plurality of inorganic films, in which a first inorganic film having a first refractive index and a second inorganic film having a second refractive index are alternately stacked, and an uppermost inorganic film exposed to the outside of the light-emitting device from among the plurality of inorganic films has a greatest thickness among the plurality of inorganic films in a first direction perpendicular to the light-emitting surface of the semiconductor light-emitting structure, and wherein the first refractive index is selected from a range of about 1.1 to about 1.5 and the second refractive index is selected from a range of about 2.0 to about 3.0.

15. The light-emitting device of claim 14, wherein the first inorganic film comprises $SiO_2$, $MgF_2$, $BaF_2$, $CaF_2$, CsF, or a combination thereof, and wherein the second inorganic film comprises $TiO_2$, $ZrO_2$, ZnO, $WO_3$, or a combination thereof.

16. The light-emitting device of claim 14, wherein the multi-inorganic-film coating layer is configured to reflect about 30% to about 95% of the light having the first wavelength, transmit about 5% to about 60% of the light having the first wavelength and transmit about 20% to about 40% of the light having the second wavelength.

17. The light-emitting device of claim 14, wherein a number of the plurality of inorganic films is 3 to 7, and wherein among the plurality of inorganic films, a lowermost inorganic film closest to the wavelength conversion layer and an uppermost inorganic film farthest from the wavelength conversion layer each comprise the first inorganic film.

18. The light-emitting device of claim 14, wherein the wavelength conversion layer comprises a glass-phosphor composite, which comprises the plurality of phosphors dispersed in a glass matrix, and wherein the plurality of phosphors comprise α-SiAlON represented by:

$$Ca_xEu_ySi_{12-m-n}Al_{m+n}O_nN_{16-n}$$

$$0.25 \le x \le 2.00,$$

$$0.001 \le y \le 0.100,$$

-continued $$0.001 \le n \le 11.490,$$

$$\text{and } 0.51 \le m+n \le 11.99.$$

19. A light-emitting device comprising:

a package substrate;

a semiconductor light-emitting structure provided on the package substrate and configured to emit light having a first wavelength selected from a range of about 400 nm to about 500 nm through a light-emitting surface;

a wavelength conversion layer facing the light-emitting surface, and comprising a glass matrix and a plurality of phosphors dispersed in the glass matrix, the plurality of phosphors being configured to emit light having a second wavelength and comprising α-SiAlON represented by $Ca_xEu_ySi_{12-m-n}Al_{m+n}O_nN_{16-n}$ (where $0.25 \le x \le 2.00$, $0.001 \le y \le 0.100$, $0.001 \le n \le 11.490$, and $0.51 \le m+n \le 11.99$);

a multi-inorganic-film coating layer spaced apart from the light-emitting surface with the wavelength conversion layer therebetween, the multi-inorganic-film coating layer being configured to simultaneously transmit both a portion of the light having the first wavelength and a portion of the light having the second wavelength; and a reflective resin layer arranged on the package substrate, a sidewall of the semiconductor light-emitting structure, a portion of a lower surface of the wavelength conversion layer, which faces the package substrate, and a sidewall of each of the wavelength conversion layer and the multi-inorganic-film coating layer, wherein the multi-inorganic-film coating layer comprises a plurality of inorganic films, in which a first inorganic film having a first refractive index and a second inorganic film having a second refractive index are alternately stacked, and an uppermost inorganic film that is externally exposed to outside the light-emitting device from among the plurality of inorganic films has a greatest thickness among the plurality of inorganic films in a first direction perpendicular to the light-emitting surface of the semiconductor light-emitting structure, wherein an upper surface of the multi-inorganic-film coating layer and an upper surface of the reflective resin layer are coplanar with each other to provide a flat surface, and wherein the first refractive index is selected from a range of about 1.1 to about 1.5 and the second refractive index is selected from a range of about 2.0 to about 3.0.

20. The light-emitting device of claim 19, wherein the first inorganic film comprises $SiO_2$, $MgF_2$, $BaF_2$, $CaF_2$, CsF, or a combination thereof, and the second inorganic film comprises $TiO_2$, $ZrO_2$, ZnO, $WO_3$, or a combination thereof, and wherein light emitted from the multi-inorganic-film coating layer corresponds to one color coordinate, which has a Cx value selected from a range of about 0.53 to about 0.60 and a Cy value selected from a range of about 0.40 to about 0.47 based on Commission Internationale de l'Eclairage (CIE) color coordinates.

* * * * *